(12) United States Patent
Choubak et al.

(10) Patent No.: US 11,447,391 B2
(45) Date of Patent: Sep. 20, 2022

(54) METHOD OF GROWING A GRAPHENE COATING OR CARBON NANOTUBES ON A CATALYTIC SUBSTRATE

(71) Applicants: POLYVALOR, LIMITED PARTNERSHIP, Montreal (CA); VALORISATION-RECHERCHE, LIMITED PARTNERSHIP, Montreal (CA)

(72) Inventors: Saman Choubak, San Mateo, CA (US); Pierre Lévesque, Montreal (CA); Philippe Gagnon, Chambly (CA); Richard Martel, Montreal (CA); Patrick Desjardins, St-Laurent (CA)

(73) Assignees: POLYVALOR, LIMITED PARTNERSHIP; VALORISATION-RECHERCHE, LIMITED PARTNERSHIP

( * ) Notice: Subject to any disclaimer, the term of this patent is extended or adjusted under 35 U.S.C. 154(b) by 433 days.

(21) Appl. No.: 15/189,545

(22) Filed: Jun. 22, 2016

(65) Prior Publication Data
US 2016/0376156 A1    Dec. 29, 2016

Related U.S. Application Data

(60) Provisional application No. 62/183,428, filed on Jun. 23, 2015.

(51) Int. Cl.
*C01B 32/182* (2017.01)
*C01B 32/162* (2017.01)
(Continued)

(52) U.S. Cl.
CPC ............ *C01B 32/162* (2017.08); *B01J 23/72* (2013.01); *B01J 23/745* (2013.01); *B01J 23/75* (2013.01);
(Continued)

(58) Field of Classification Search
None
See application file for complete search history.

(56) References Cited

U.S. PATENT DOCUMENTS 7,157,068 B2 * 1/2007 Li .................. B01J 23/745
                                            423/447.3
8,471,132 B1 * 6/2013 Jiang .................. G01J 1/4257
                                            423/256

(Continued)

OTHER PUBLICATIONS

In et al "Growth Kinetics of Vertically Aligned Carbon Nanotube Arrays in Clean Oxygen-free Conditions" ACS Nano, Vo. 5, No. 12, 9602-9610 (Year: 2011).*

(Continued)

*Primary Examiner* — Mandy C Louie
(74) *Attorney, Agent, or Firm* — Lavery, De Billy, LLP; Isabelle Pelletier

(57) ABSTRACT

A method of growing a graphene coating or carbon nanotubes on a catalytic substrate by chemical vapor deposition is provided. In the method, the chemical vapor deposition is carried out in an atmosphere in which a ratio $P_{ox}/P_{red}$ is about $5\times10^{-26}$ or less, wherein $P_{ox}$ is the partial pressure oxidizing species in the atmosphere and $P_{red}$ is the partial pressure of reducing species in the atmosphere. A catalytic substrate coated with a graphene coating grown according to this method is also provided.

19 Claims, 12 Drawing Sheets

(51) Int. Cl.
| | |
|---|---|
| C23C 16/26 | (2006.01) |
| C23C 16/01 | (2006.01) |
| C23C 16/455 | (2006.01) |
| B01J 23/72 | (2006.01) |
| B01J 23/745 | (2006.01) |
| B01J 37/06 | (2006.01) |
| B01J 23/75 | (2006.01) |
| B01J 37/08 | (2006.01) |
| B01J 23/755 | (2006.01) |
| C01B 32/186 | (2017.01) |

(52) U.S. Cl.
CPC ............. *B01J 23/755* (2013.01); *B01J 37/06* (2013.01); *B01J 37/08* (2013.01); *C01B 32/186* (2017.08); *C23C 16/01* (2013.01); *C23C 16/26* (2013.01); *C23C 16/45557* (2013.01)

(56) References Cited

U.S. PATENT DOCUMENTS

| | | | | |
|---|---|---|---|---|
| 2002/0102353 | A1* | 8/2002 | Mauthner | B82Y 30/00 427/255.28 |
| 2004/0105807 | A1* | 6/2004 | Fan | B82Y 30/00 423/447.3 |
| 2004/0150312 | A1* | 8/2004 | McElrath | C01B 32/168 313/310 |
| 2005/0075708 | A1* | 4/2005 | O'Brien | A61N 1/05 607/116 |
| 2007/0116631 | A1* | 5/2007 | Li | D01F 9/1273 423/447.3 |
| 2009/0230979 | A1* | 9/2009 | Omote | B82Y 10/00 324/693 |
| 2010/0098904 | A1* | 4/2010 | Dai | B82Y 30/00 428/119 |
| 2010/0255984 | A1* | 10/2010 | Sutter | B82Y 30/00 502/185 |
| 2012/0298619 | A1* | 11/2012 | Jiang | B82Y 40/00 216/20 |
| 2015/0064098 | A1* | 3/2015 | Grobert | B82Y 30/00 117/97 |

OTHER PUBLICATIONS

Trinsoutrot "High quality graphene synthesized by atmospheric pressure CVD on copper foil" Surface Coating Tech. 230 p. Jun. 2013 p. 87-92. (Year: 2013).*
In "Growth Kinetics of Vertically Aligned Carbon Nanotube Arrays in Clean Oxygen-free Conditions" ACSNano vol. 5 No. 12 Nov. 2011 p. 9602-9610 (Year: 2011).*
Kim "Growth of CVD graphene on copper by rapid thermal processing" Mat. Resc. Soc. Symp Proc vol. 1451 2012 Materials Research Soc. (Year: 2012).*
Lisi et al. "Rapid and highly efficient growth of graphene on copper by chemical vapor deposition of ethanol" Thin solid film 571 (2014) 139-144.*
Tiwari "CVD Graphene on Metals for Remarkable Corrosion Resistance" Corrosion and Prevention 2012 paper 133.*
Shin Y. C. and Kong J., "Hydrogen-excluded graphene synthesis via atmospheric pressure chemical vapor deposition," Carbon, 59, 439-447, 2013.
Srivastava A., Galande C., Ci L., Song L., Rai C., Jariwala D., Kelly K. F., Ajayan P. M., "Novel Liquid Precursor-Based Facile Synthesis of Large-Area Continuous, Single, and Few-Layer Graphene Films," Chem.Mater., 22, 3457-3461, 2010.
Suk J. W., Kitt A., Magnuson C. W., Hao Y., Ahmed S., An J. H., Swan A. K., Goldberg B. B., Ruoff R. S., "Transfer of CVD-Grown Monolayer Graphene onto Arbitrary Substrates," Acs Nano, 5, 6916-6924, Sep. 2011.
Tao L., Lee J., Chou H., Holt M., Ruoff R. S., Akinwande D., "Synthesis of High Quality Monolayer Graphene at Reduced Temperature on Hydrogen-Enriched Evaporated Copper (111) Films," ACS Nano, 6, 2319-2325, 2012.
Tomo-O T. and Koichiro S., "Effect of vapor-phase oxygen on chemical vapor deposition growth of graphene," Applied Physics Express, 8, 035101, 2015.
Vlassiouk I., Fulvio P., Meyer H., Lavrik N., Dai S., Datskos P., Smirnov S., "Large scale atmospheric pressure chemical vapor deposition of graphene," Carbon, 54, 58-67, Apr. 2013.
Vlassiouk I., Regmi M., Fulvio P., Dai S., Datskos P., Eres G., Smirnov S., "Role of Hydrogen in Chemical Vapor Deposition Growth of Large Single-Crystal Graphene," Acs Nano, 5, 6069-6076, Jul. 2011.
Wood J. D., Schmucker S. W., Lyons A. S., Pop E., Lyding J. W., "Effects of Polycrystalline Cu Substrate on Graphene Growth by Chemical Vapor Deposition" Nano Lett. 2011, 11, 4547-4554.
Wu B., Geng D., Xu Z., Guo Y., Huang L., Xue Y., Chen J., Yu G., Liu Y., "Self-Organized Graphene Crystal Patterns," NPG Asia Mater., 5, p. e36, 2013.
Xue Y., Wu B., Jiang L., Guo Y., Huang L., Chen J., Tan J., Geng D., Luo B., Hu W., Yu G., Liu Y., "Low temperature growth of highly nitrogen-doped single crystal graphene arrays by chemical vapor deposition," JACS. 2012, 134, 11060-11063.
Yan K., Peng H., Zhou Y., Li H., Liu Z., "Formation of bilayer bernal graphene: layer-by-layer epitaxy via chemical vapor deposition," Nano Letters, 11, 1106-10, Mar. 9, 2011.
Yan Z., Lin J., Peng Z., Sun Z., Zhu Y., Li L Xiang C., Samuel E. L., Kittrell C., Tour J. M., "Toward the synthesis of wafer-scale single-crystal graphene on copper foils," ACS Nano. 2012, 6, 9110-9117.
Yao Y. and Wong C.-P., "Monolayer graphene growth using additional etching process in atmospheric pressure chemical vapor deposition," Carbon, 50, 5203-5209, 2012.
Yao Y., Li Z., Lin Z. Y., Moon K.-S., Agar J., Wong C., "Controlled Growth of Multilayer, Few-Layer, and Single-Layer Graphene on Metal Substrates," J. Phys.Chem C, 115, 5232-5238, 2011.
Zhang B., Lee W. H., Piner R., Kholmanov I., Wu Y., Li H., Ji H., Ruoff R. S., "Low-temperature chemical vapor deposition growth of graphene from toluene on electropolished copper foils," ACS Nano. 2012, 6, 2471-2476.
Zhang W., Wu P., Li Z., Yang J., "First-Principles Thermodynamics of Graphene Growth on Cu Surfaces," The Journal of Physical Chemistry C, 115, 17782-17787, 2011.
Zhang Y., Zhang L., Kim P., Ge M., Zhen L., Zhou C., "Vapor Trapping Growth of Single-Crystalline Graphene Flowers: Synthesis, Morphology, and Electronic Properties." Nano Lett., 12, 2810-2816, 2012.
Zhang Y., Li Z., Kim P., Zhang L. Y., Zhou C., "Anisotropic Hydrogen Etching of Chemical Vapor Deposited Graphene", Acs Nano, 6, 126-132, 2012.
Zhang Y., Zhang L., Zhou C., "Review of chemical vapor deposition of graphene and related applications," Acc. Chem. Res. 2013, 46, 2329-39.
Zhao P., Kumamoto A., Kim S., Chen X., Hou B., Chiashi S., Einarsson E., Ikuhara Y., Maruyama S., "Self-limiting chemical vapor deposition growth of monolayer graphene from ethanol" J. Phys. Chem. C. 2013, 117, 10755-10763.
Ago H., Ogawa Y., Tsuji M., Mizuno S., Hibino H., "Catalytic Growth of Graphene: Toward Large-Area Single-Crystalline Graphene," Journal of Physical Chemistry Letters, 3, 2228-2236, Aug. 16, 2012.
Bae S., Kim H., Lee Y., Xu X. F., Park J.-S., Zheng Y., Balakrishnan J., Lei T., Kim H. R., Song Y. L, Kim Y. J., Kim K. S., Ozyilmaz B., Ahn J.-H., Hong B. H., Iijima S., "Roll-to-roll production of 30-inch graphene films for transparent electrodes," Nature Nanotechnology, 5, 574-578, Aug. 2010. Published online on Jun. 20, 2010.
Bhaviripudi S., Jia X., Dresselhaus M. S., Kong J., "Role of Kinetic Factors in Chemical Vapor Deposition Synthesis of Uniform Large Area Graphene Using Copper Catalyst," Nano Letters, 10, 4128-4133, Oct. 2010.
Bundy F. P., "Pressure-temperature phase diagram of elemental carbon," Physica A, 1989, 156, 169-178.

(56) References Cited

OTHER PUBLICATIONS

Carozo V., Almeida C. M., Ferreira E. H., Cancado L. G., Achete C. A., Jorio A., "Raman signature of graphene superlattices," Nano Letters, 11, 4527-34, Nov. 9, 2011.
Celebi K., Cole M. T., Choi J. W., Wyczisk F., Legagneux P., Rupesinghe N., Robertson J., Teo K. B. K., Park H. G., "Evolutionary Kinetics of Graphene Formation on Copper," Nano Letters, 13, 967-974, Mar. 13, 2013.
Chen S., Ji H., Chou H., Li Q., Li H., Suk J. W., Piner R., Liao L., Cai W., Ruoff R. S., "Millimeter-size Single-crystal graphene by suppressing evaporative loss of Cu during low pressure chemical vapor deposition," Adv. Mater. 2013, 25, 2062-2065.
Choubak S., Biron M., Levesque P. L., Martel R., Desjardins P., "No Graphene Etching in Purified Hydrogen," Journal of Physical Chemistry Letters, 4, 1100-1103, Apr. 4, 2013.
Choubak S., Levesque P. L., Gaufres E., Biron M., Desjardins P., Martel R., "Graphene CVD: Interplay between growth and etching on morphology and stacking by hydrogen and oxidizing impurities," J. Phys. Chem. C 2014, 118, 21532-21540.
Choubak S., Levesque P. L., Gaufres E., Biron M., Desjardins P., Martel R., "Graphene CVD: Interplay between growth and etching on morphology and stacking by hydrogen and oxidizing impurities," Presentation Fourth International Symposium of Graphene Devices Sep. 2014.
Chu P. K. and Li L., "Characterization of amorphous and nanocrystalline carbon films," Materials Chemistry and Physics, 96, 253-277, 2006.
Clavaguera-Mora M. T., Touron J. L., Rodriguez-Viejo J., Clavaguera N., "Thermodynamic description of the Cu—O system," J. Alloys and Compounds, 2004, 377, 8-16.
Fan L., Li Z., Li X., Wang K., Zhong M., Wei J., Wu D., Zhu H., "Controllable growth of shaped graphene domains by atmospheric pressure chemical vapour deposition," Nanoscale, 3, 2011, 4946-4950.
Fan L., Zou J., Li Z., Li X., Wang K., Wei J., Zhong M., Wu D., Xu Z., Zhu H., "Topology evolution of graphene in chemical vapor deposition, a combined theoretical/experimental approach toward shape control of graphene domains," Nanotechnology, 23, Mar. 23, 2012.
Fang W., Hsu A. L., Caudillo R., Song Y., Birdwell A. G., Zakar E., Kalbac M., Dubey M., Palacios T., Dresselhaus M. S., Araujo P. T., Kong J., "Rapid Identification of Stacking Orientation in Isotopically Labeled Chemical-Vapor Grown Bilayer Graphene by Raman Spectroscopy," Nano Letters, 13, 1541-1548, Apr. 2013.
Ferrari A. C., Meyer J. C., Scardaci V., Casiraghi C., Lazzeri M., Mauri F., Piscanec S., Jiang D., Novoselov K. S., Roth S., Geim A. K., "Raman Spectrum of Graphene and Graphene Layers," Physical Review Letters, 97, 2006, 187401.
Gao L., Ren W., Zhao J., Ma L.-P., Chen Z., Cheng H.-M., "Efficient growth of high-quality graphene films on Cu foils by ambient pressure chemical vapor deposition," Applied Physics Letters, 97, Nov. 1, 2010, 183109.
Han Z., Kimouche A., Kalita D., Allain A., Arjmandi-Tash H., Reserbat-Plantey A., Marty L., Pairis S., Reita V., Bendiab N., Coraux J., Bouchiat V., "Homogeneous Optical and Electronic Properties of Graphene Due to the Suppression of Multilayer Patches During CVD on Copper Foils," Adv. Func. Mater., 24, 964-970, 2014.
Hao Y., Bharathi M. S., Wang L., Liu Y., Chen H., Nie S., Wang X., Chou H., Tan C., Fallahazad B., Ramanarayan H., Magnuson C. W., Tutuc E., Yakobson B. L., McCarty K. F., Zhang Y.-W., Kim P., Hone J., Colombo L., Ruoff R. S., "The role of surface oxygen in the growth of large single-crystal graphene on copper," Science, 342, 720-3, Nov. 8, 2013.
Havener R. W., Zhuang H., Brown L., Hennig R. G., Park J., "Angle-Resolved Raman Imaging of Inter layer Rotations and Interactions in Twisted Bilayer Graphene," Nano Letters, 12, 3162-3167, Jun. 2012.
He R., T. Chung T.-F., Delaney C., Keiser C., Jauregui L. A., Shand P. M., Chancey C. C., Wang Y., Bao J., Chen Y. P., "Observation of Low Energy Raman Modes in Twisted Bilayer Graphene," Nano Letters, 13, 3594-3601, Aug. 2013.
Jacobberger R. M. and Arnold M. S., "Graphene Growth Dynamics on Epitaxial Copper Thin Films," Chemistry of Materials, 25, 871-877, Mar. 26, 2013.
Jenks C. J., Bent B. E., Zaera F., "The chemistry of alkyl iodides on copper surfaces. 2. Influence of surface structure on reactivity," J. Phys. Chem. B. 2000, 104 (14), 3017-3027.
Kalbac M., Frank O., Kavan L., "The control of graphene double-layer formation in copper-catalyzed chemical vapor deposition," Carbon, 50, 3682-3687, 2012.
Kidambi P. R., Ducati C., Dlubak B., Gardiner D., Weatherup R. S., Martin M.-B., Seneor P., Coles H., Hofmann S., "The Parameter Space of Graphene Chemical Vapor Deposition on Polycrystalline Cu," The Journal of Physical Chemistry C, 116, 22492-22501, 2012.
Kim H., Kim E., Lee W.-J., Jung J., "Effects of hydrogen in the cooling step of chemical vapor deposition of graphene," Electronic Materials Letters 2013, 9, 417-420.
Kim H., Mattevi C., Calvo M. R., Oberg J. C., Artiglia L., Agnoli S., Hirjibehedin C. F., Chhowalla M., Saiz E., "Activation Energy Paths for Graphene Nucleation and Growth on Cu," ACS Nano. 2012, 6, 3614-3623.
Kim H., Saiz E., Chhowalla M., Mattevi C., "Modeling of the self-limited growth in catalytic chemical vapor deposition of graphene," New J. Phys. 2013, 15, 053012.
Kobayashi T., Bando M., Kimura N., Shimizu K., Kadono K., Umezu N., Miyahara K., Hayazaki S., Nagai S., Mizuguchi Y., Murakami Y., Hobara D., "Production of a 100-m-long high-quality graphene transparent conductive film by roll-to-roll chemical vapor deposition and transfer process," Appl. Phys. Lett. 2013, 102, 023112.
Li Q., Chou H., Zhong J.-H., Liu J.-Y., Dolocan A., Zhang J., Zhou Y., Ruoff R. S., Chen S., Cai W., "Growth of Adlayer Graphene on Cu Studied by Carbon Isotope Labeling," Nano Letters, 13, 486-490, Feb. 2013.
Li X., Cai W., An J., Kim S., Nah J., Yang D., Piner R., Velamakanni A., Jung I., Tutuc E., Banerjee S. K., Colombo L., Ruoff R. S., "Large-area synthesis of high-quality and uniform graphene films on copper foils," Science, 324, 1312-4, Jun. 5, 2009.
Li X., Magnuson C. W., Venugopal A., An J., Suk J. W., Han B., Borysiak M., Cai W, Velamakanni A., Zhu Y., Fu L., Vogel E. M., Voelkl E., Colombo L., Ruoff R. S., "Graphene Films with Large Domain Size by a Two-Step Chemical Vapor Deposition Process," Nano Letters, 10, 4328-4334, Nov. 2010.
Li X., Magnuson C. W., Venugopal A., Tromp R. M., Hannon J. B., Vogel E. M., Colombo L., Ruoff R. S., "Large-area graphene single crystals grown by low-pressure chemical vapor deposition of methane on copper," Journal of the American Chemical Society, 133, 2816-9, Mar. 9, 2011.
Li Z., Wu P., Wang C., Fan X., Zhang W., Zhai X., Zeng C., Li Z., Yang J., Hou J., "Low-temperature growth of graphene by chemical vapor deposition using solid and liquid carbon source," ACS Nano 2011, 5, 3385-3390.
Lisi N., Buonocore F., Dikonimos T., Leoni E., Faggio G., Messina G., Morandi V., Ortolani L., Capasso A., "Rapid and Highly Efficient Growth of Graphene on Copper by Chemical Vapor deposition of Ethanol," Thin Solid Films, 571, 1, 139-144, 2014.
Liu L., Zhou H., Cheng R., Chen Y., Lin Y.-C., Qu Y., Bai J., Ivanov I. A., Liu G., Huang Y., Duan X., "A systematic study of atmospheric pressure chemical vapor deposition growth of large-area monolayer graphene," Journal of Materials Chemistry, 22, 1498-1503, 2012.
Loginova E., Bartelt N. C., Feibelman P. J., McCarty K. F., "Factors influencing graphene growth on metal surfaces," New J. Phys. 2009, 11(6), 063046.
Losurdo M., Giangregorio M. M., Capezzuto P., Bruno G., "Graphene CVD growth on copper and nickel: role of hydrogen in kinetics and structure," Phys Chem Chem Phys, 13, 20836-43, Dec. 14, 2011.
Madix R. J. and Benziger J., "Kinetic Processes on Metal Single-Crystal Surfaces," Annual Review of Physical Chemistry, 29, 285-306, 1978.

(56) References Cited

OTHER PUBLICATIONS

Magnuson C. W., Kong X., Ji H., Tan C., Li H., Piner R., Ventrice C. A. Jr., Ruoff R. S., "Copper oxide as a "self-cleaning" substrate for graphene growth," Journal of Materials Research, 29, 403-409, 2014.

Marcet S., Verhaegen M., Blais-Ouellette S., Martel R., "Raman spectroscopy hyperspectral imager based on Bragg tunable filters," 2012, 84121J-84121J-7.

Mattevi C., Kim H., Chhowalla M., "A review of chemical vapour deposition of graphene on copper," Journal of Materials Chemistry, 21, p. 3324, 2011.

Mehdipour H. and Ostrikov K., "Kinetics of Low-Pressure, Low-Temperature Graphene Growth: Toward SingleLayer, Single-Crystalline Structure," ACS Nano 2012, 6, 10276-10286.

Miao C., Zheng C., Liang O. Xie Y.-H., "Chemical Vapor Deposition of Graphene, Physics and Application of Graphene," Intech, 52, 5, 2011.

Monazam E. R., Siriwardane R., Breault R. W., Tian H., Shadle L. J., Richards G., Carpenter S., "Kinetics of the Reduction of CuO/Bentonite by Methane (CH4) during Chemical Looping Combustion," Energy & Fuels, 26, 2779-2785, 2012.

Munoz R., Gomez-Aleixandre C., "Review of CVD Synthesis of Graphene," Chem. Vap. Deposition, 19, 297-322, 2013.

Nie S., Wu W., Xing S., Yu Q., Bao J., Pei S.-s., McCarty K. F., "Growth from below: bilayer graphene on copper by chemical vapor deposition," New Journal of Physics, 14, p. 093028, 2012.

Reckinger N., Felten A., Santos C. N., Hackens B., Colomer J.-F., "The influence of residual oxidizing impurities on the synthesis of graphene by atmospheric pressure chemical vapor deposition," Carbon, 63, 84-91, 2013.

Robertson A. W. and Warner J. H., "Hexagonal single crystal domains of few-layer graphene on copper foils," Nano Letters, 11, 1182-9, Mar. 9, 2011.

Safron N. S., Kim M., Gopalan P., Arnold M. S., "Barrier-guided growth of micro- and nano-structured graphene," Advanced Materials, 24, 1041-5, 2012.

Air Liquide America Speciality Gases LLC, Pures Gases, Alphagaz.

Praxair, Helium, Section B—Pure Gases, p. B-53.

Praxair, Hydrogen, Section B—Pure Gases, p. B-54.

Johnson Matthey, Pure Guard, Oxygen Removing Purifiers.

Wikipedia, Hydrogen purifier.

Air Liquide, Alphagaz 1 Helium, Air Liquide's Gas Encyclopedia, p. 989-998.

Praxair, Ethylene, Section B—Pure Gases, p. B-42.

Linde, HIQ Speciality Gases Finder, Hydrogen H2.

Linde, HIQ Speciality Gases Finder, Helium He.

Matheson Gas, Pure Gases, Ethylene, p. 25.

Matheson Gas, Pure Gases, Hydrogen, p. 30.

Matheson Gas, Pure Gases, Helium, p. 28.

L. Lin et al, "Towards super-clean graphene", Nature Communications, 2019, vol. 10, No. 1912, pp. 1-7; https://doi.org/10.1038/s41467-019-09565-4.

S. Böhm, "Graphene againt corrosion", Nature Nanotechnology, Oct. 2014, vol. 9, pp. 741-742.

F. Zhou et al., "Enhanced Room-Temperature Corrosion of Copper in the Presence of Graphene", ACS Nano, 2013, vol. 7, No. 8, pp. 6939-6947.

M. Schriver et al., "Graphene as a Long-term Metal Oxidation Barrier: Worse than nothing", ACS Nano, 2013, vol. 7, No. 7, pp. 5763-5768.

C. Cui et al., "A cautionary note on graphene anti-corrosion coatings", Nature Nanotechnology, Sep. 2017, vol. 12, pp. 834-835.

Z. Zhao et al. ,"Polycrystalline Few-Layer Graphene as a durable anticorrosion film for copper", Nano Letters, 2021, vol. 21, pp. 1161-1168.

\* cited by examiner

METHOD OF GROWING A GRAPHENE COATING OR CARBON NANOTUBES ON A CATALYTIC SUBSTRATE

CROSS REFERENCE TO RELATED APPLICATIONS

This application claims benefit, under 35 U.S.C. § 119(e), of U.S. provisional application Ser. No. 62/183,428, filed on Jun. 23, 2015. All documents above are incorporated herein in their entirety by reference.

FIELD OF THE INVENTION

The present invention relates to a method of growing a graphene coating or carbon nanotubes on a catalytic substrate. More specifically, the present invention is concerned with method of growing a graphene coating or carbon nanotubes on a catalytic substrate by chemical vapor deposition of a carbon-containing gas.

BACKGROUND OF THE INVENTION

Chemical vapor deposition (CVD) of graphene on copper substrates demonstrates great potential for its large-scale production and its integration in industrial applications. In fact, it is one of the most promising and widely employed methods to produce large graphene sheets of high quality.

Low-pressure chemical vapor deposition (LP-CVD) of graphene films, demonstrated for the first time less than six years ago [X. Li, W. Cai, J. An, S. Kim, J. Nah, D. Yang, R. Piner, A. Velamakanni, I. Jung, E. Tutuc, S. K. Banerjee, L. Colombo, and R. S. Ruoff, "Large-area synthesis of high-quality and uniform graphene films on copper foils," *Science*, vol. 324, pp. 1312-4, Jun. 5, 2009], is viewed as a potentially scalable and efficient process compatible with industrial requirements. This most popular route for graphene growth involves a low-pressure mixture of methane and hydrogen flowing over a copper substrate heated to a temperature of ~1000° C., a value slightly below its melting point. Ever since, a plethora of publications investigating a vast array of graphene synthesis conditions has followed.

Notably, considerable efforts have been invested on varying the hydrogen and methane flow ratio in order to control the shape and growth of graphene domains. In fact, many articles report major efforts for optimizing the quality of graphene films by varying, for example, $H_2$ to $CH_4$ ratios, precursor gas flow rates and total reactor pressure. In particular, the role of hydrogen has become the subject of intense research. While most studies conclude that hydrogen is required for graphene CVD, a few groups, including ours, reported hydrogen-free growth in the sole presence of methane as the carbon source.

Further, several articles report experiments designed to investigate the role of $H_2$ on the etching of graphene films at high temperature. A careful analysis of all these articles reveals however numerous inconsistencies. Indeed, the growth of high quality graphene layers by CVD has been found to strongly depend on growth conditions with results varying greatly from one laboratory to another for nominally identical conditions.

According to the literature, the formation of continuous monolayer coverage of graphene on copper requires high temperatures and long growth times, therefore making this process unsuitable for industrial manufacturing. Indeed, despite substantial efforts, obtaining continuous monolayer graphene coverage with low defect density remains a challenge and can generally only be achieved at high temperatures and after long growth times.

Up to now, many milestones have been achieved by introducing roll-to-roll production and also by adapting growth recipes with a local heating of the copper substrate in order to reduce cost and save energy. While roll-to-roll approaches are potentially interesting in terms of scalability and manufacturing volume, they still require long growth times and high temperature; thus the associated energy cost remains prohibitive. Local heating synthesis routes, although much more cost- and time-effective, currently result in lower quality films with microcracks. Others have investigated graphene CVD growth at lower temperature in an attempt to reduce the energy cost and make the graphene synthesis more suitable for industrial manufacturing processes. However, the resulting processes are still too long and generally fail to enhance the economical viability of the mass production of graphene material.

Thus, the large scale manufacturing of graphene films by CVD has so far been hindered by these constraints. Thus, crucial questions in graphene LP-CVD growth remain unresolved: Why is the growth of graphene on copper so slow? More specifically how can one speed up the process while maintaining or even improving film quality?

Our group has suggested that, contrary to common belief, $H_2$ does not appear to etch graphene during post growth annealing, but that oxidizing impurities would appear to be responsible for etching, and that Cu appears to play a catalytic role not only for growth but also for etching [S. Choubak, M. Biron, P. L. Levesque, R. Martel, and P. Desjardins, "No Graphene Etching in Purified Hydrogen," *Journal of Physical Chemistry Letters*, vol. 4, pp. 1100-1103, Apr. 4, 2013]. However this remained a much debated subject. In particular, the roles of $H_2$ and oxidizing impurities during the growth of the graphene layer (rather than during post growth annealing) remained to be established.

Many articles published both before and after our above 2013 paper in Journal of Physical Chemistry Letters, some of them even citing it, illustrate this debate. Indeed, they show that most researchers and experts in this field continue to think that $H_2$ is etching at some level. These articles discuss the role of hydrogen and its influence on the formation of graphene on copper foil. For example, they advance that changing hydrogen pressure during growth leads to different graphene morphologies. They also report endeavours to find the best recipe for graphene growth, control the shape and size of graphene domains, and to understand the role of gases on the morphology of the films by changing the total pressure of the CVD process and the methane to hydrogen ratio. They also contain different recipes involving $H_2$, known as "etching-aided" or "pulsed" CVD, to grow monolayer graphene films. Exemplary articles are listed below; those preceded with three stars (***) cite our 2013 paper in Journal of Physical Chemistry Letters.

P. R. Kidambi, C. Ducati, B. Dlubak, D. Gardiner, R. S. Weatherup, M.-B. Martin, P. Seneor, H. Coles, and S. Hofmann, "The Parameter Space of Graphene Chemical Vapor Deposition on Polycrystalline Cu," *J. Phys. Chem. C,*116, 22492-22501, 2012.

I. Vlassiouk, M. Regmi, P. F. Fulvio, S. Dai, P. Datskos, G. Eres, and S. Smirnov, "Role of Hydrogen in Chemical Vapor Deposition Growth of Large Single-Crystal Graphene," *ACS Nano,* 5, 6069-6076, 2011.

M. Losurdo, M. M. Giangregorio, P. Capezzuto, and G. Bruno, "Graphene CVD growth on copper and nickel: role of hydrogen in kinetics and structure," *Phys Chem Chem Phys*, vol. 13, pp. 20836-43, Dec. 14, 2011.

Y. C. Shin and J. Kong, "Hydrogen-Excluded Graphene Synthesis via Atmospheric Pressure Chemical Vapor Deposition," *Carbon,* 59, 439-447, 2013.

Y. Zhang, Z. Li, P. Kim, L. Y. Zhang, and C. W. Zhou, "Anisotropic Hydrogen Etching of Chemical Vapor Deposited Graphene" *ACS Nano,* 6, 6526-6526, 2012.

L. Tao, J. Lee, H. Chou, M. Holt, R. S. Ruoff, and D. Akinwande, "Synthesis of High Quality Monolayer Graphene at Reduced Temperature on Hydrogen-Enriched Evaporated Copper (111) Films," *ACS Nano,* 6, 2319-2325, 2012.

A. Srivastava, C. Galande, L. Ci, L. Song, C. Rai, D. Jariwala, K. F. Kelly, and P. M. Ajayan, "Novel Liquid Precursor-Based Facile Synthesis of Large-Area Continuous, Single, and Few-Layer Graphene Films," *Chem. Mater.,* 22, 3457-3461, 2010.

P. Zhao, A. Kumamoto, S. Kim, X. Chen, B. Hou, S. Chiashi, E. Einarsson, Y. Ikuhara, and S. Maruyama, "Self-Limiting Chemical Vapor Deposition Growth of Monolayer Graphene from Ethanol," *J. Phys. Chem. C,* 117, 10755-10763, 2013.

M. Kalbac, O. Frank, and L. Kavan, "The Control of Graphene Double-Layer Formation in Copper-Catalyzed Chemical Vapor Deposition," *Carbon,* 50, 3682-3687, 2012.

Wu, D. Geng, Z. Xu, Y. Guo, L. Huang, Y. Xue, J. Chen, G. Yu, and Y. Liu, "Self-Organized Graphene Crystal Patterns," *NPG Asia Mater.,* 5, p. e36, 2013.

Y. Yao and C. P. Wong, "Monolayer Graphene Growth using Additional Etching Process in Atmospheric Pressure Chemical Vapor Deposition," *Carbon,* 50, 5203-5209, 2012.

Y. G. Yao, Z. Li, Z. Y. Lin, K. S. Moon, J. Agar, and C. P. Wong, "Controlled Growth of Multilayer, Few-Layer, and Single-Layer Graphene on Metal Substrates," *J. Phys. Chem. C,* 115, 5232-5238, 2011.

***Z. Han, A. Kimouche, D. Kalita, A. Allain, H. Arjmandi-Tash, A. Reserbat-Plantey, L. Marty, S. Pairis, V. Reita, N. Bendiab, J. Coraux, and V. Bouchiat, "Homogeneous Optical and Electronic Properties of Graphene Due to the Suppression of Multilayer Patches During CVD on Copper Foils," *Adv. Func. Mater.,* 24, 964-970, 2014.

H. Ago, Y. Ogawa, M. Tsuji, S. Mizuno, and H. Hibino, "Catalytic Growth of Graphene: Toward Large-Area Single-Crystalline Graphene," *J. Phys. Chem. Lett.,* 3, 2228-2236, 2012.

Y. Zhang; L. Zhang; P. Kim; M. Ge; L. Zhen; C. Zhou, "Vapor Trapping Growth of Single-Crystalline Graphene Flowers: Synthesis, Morphology, and Electronic Properties." *Nano Lett.,* 12, 2810-2816, 2012.

R. M. Jacobberger; M. S. Arnold. "Graphene Growth Dynamics on Epitaxial Copper Thin Films." *Chem. Mater.,* 25, 871-877, 2013.

***N. Reckinger; A. Felten; C. N. Santos; B. Hackens; J.-F, Colomer. "The Influence of Residual Oxidizing Impurities on the Synthesis of Graphene by Atmospheric Pressure Chemical Vapor Deposition." *Carbon,* 63, 84-91, 2013.

***C. W. Magnuson, X. Kong, H. Ji, C. Tan, H. Li, R. Piner, C. A. J. Ventrice, and R. S. Ruoff, "Copper oxide as a "self-cleaning" substrate for graphene growth," *Journal of Materials Research,* 29, 403-409, 2014.

N. S. Safron, M. Kim, P. Gopalan, and M. S. Arnold, "Barrier-guided growth of micro- and nano-structured graphene," *Advanced Materials,* 24, 1041-5, 2012.

***T. Tomo-o and S. Koichiro, "Effect of vapor-phase oxygen on chemical vapor deposition growth of graphene," *Applied Physics Express,* 8, 035101, 2015.

Similarly, other articles published show that researchers in this field continue to think that oxygen increases the growth rate of graphene or somehow aids graphene rapid formation. Exemplary articles are listed below, the article preceded with three stars (***) cites our 2013 paper in Journal of Physical Chemistry Letters.

***N. Lisi, F. Buonocore, T. Dikonimos, E. Leoni, G. Faggio, G. Messina, V. Morandi, L. Ortolani, and A. Capasso, "Rapid and Highly Efficient Growth of Graphene on Copper by Chemical Vapor deposition of Ethanol," *Thin Solid Films,* 571, 1, 139-144, 2014.

Y. Hao, M. S. Bharathi, L. Wang, Y. Liu, H. Chen, S. Nie, X. Wang, H. Chou, C. Tan, B. Fallahazad, H. Ramanarayan, C. W. Magnuson, E. Tutuc, B. I. Yakobson, K. F. McCarty, Y. W. Zhang, P. Kim, J. Hone, L. Colombo, and R. S. Ruoff, "The Role of Surface Oxygen in the Growth of Large Single-Crystal Graphene on Copper," *Science,* 342, 720-3, 2013.

SUMMARY OF THE INVENTION

In accordance with the present invention, there is provided:

1. A method of growing a graphene coating or carbon nanotubes on a catalytic substrate by chemical vapor deposition, wherein said chemical vapor deposition is carried out in an atmosphere in which a ratio $$\frac{P_{ox}}{P_{red}}$$

is about $5 \times 10^{-6}$ or less, wherein $P_{ox}$ is the partial pressure oxidizing species in the atmosphere and $P_{red}$ is the partial pressure of reducing species in the atmosphere.

2. The method of item 1, comprising the step of exposing the catalytic substrate to a carbon-containing gas at a growth temperature that allows reaction of the carbon-containing gas with the catalytic substrate, thereby producing with the graphene coating or the carbon nanotubes on the catalytic substrate in the atmosphere in which the ratio $$\frac{P_{ox}}{P_{red}}$$

is about $5 \times 10^{-6}$ or less.

3. The method of item 1 or 2, comprising the steps of:
    a) heating said catalytic substrate at the growth temperature,
    b) exposing the catalytic substrate heated at said growth temperature to a gaseous atmosphere, for example a gaseous flow, of a carbon-containing gas, thereby growing the graphene coating or the carbon nanotubes on the catalytic substrate, and
    c) cooling said catalytic substrate down to a temperature at which etching of the graphene coating or the carbon nanotubes by oxidizing species does not occur,
   wherein steps b) and c) are carried out in the atmosphere in which the ratio $$\frac{P_{ox}}{P_{red}}$$

is about $5 \times 10^{-6}$ or less.

4. The method of item 3, wherein the ratio $$\frac{P_{ox}}{P_{red}}$$

is about 5×10$^{-8}$ or less during steps b) and c).
5. The method of item 3 or 4, wherein steps b) and c) are carried out in an atmosphere having a reduced content of oxidizing species.
6. The method of any one of items 3 to 5, wherein all gases used during steps b) and c) are purified before use so as to comprise about 100 ppb or less of oxidizing species.
7. The method of any one of items 3 to 6, wherein steps b) and c) are carried out under a gaseous atmosphere, for example a gaseous flow, of a reducing species.
8. The method of any one of items 3 to 7, wherein steps b) and c) are carried out in an atmosphere having a reduced content of oxidizing species and under a gaseous atmosphere, for example a gaseous flow, of a reducing species.
9. The method of any one of items 3 to 8, wherein all gases used during steps b) and c) are purified before use so as to comprise about 1 ppm or less of oxidizing species.
10. The method of any one of items 3 to 9, wherein step a) is carried out under a gaseous atmosphere, for example a gaseous flow, of a reducing species or a gaseous atmosphere, for example a gaseous flow, of an inert species.
11. The method of any one of items 3 to 10, wherein step a) is carried out in the absence of the carbon-containing gas.
12. The method of any one of items 3 to 11, wherein step c) is carried out in the absence of the carbon-containing gas.
13. The method of any one of items 3 to 12, wherein after step b) and prior to step c), the gaseous atmosphere, for example the gaseous flow, of the carbon-containing gas is interrupted and the carbon-containing gas is evacuated.
14. The method of any one of items 3 to 13, further comprising, before step a), an annealing step comprising heating the catalytic substrate at an annealing temperature and annealing the catalytic substrate at said annealing temperature.
15. The method of item 14, wherein the annealing step is carried out under a gaseous atmosphere, for example a gaseous flow, of a reducing species or a gaseous atmosphere, for example a gaseous flow, of an inert species.
16. The method of item 14 or 15, wherein the annealing step is carried out in the absence of the carbon-containing gas.
17. The method of any one of items 3 to 16, wherein step b) last about 5 minutes or less, for example in about 1 minute.
18. The method of any one of items 1 to 17, wherein a graphene coating is grown.
19. The method of any one of items 1 to 18, wherein the carbon-containing gas is a hydrocarbon.
20. A catalytic substrate coated with a graphene coating grown according to the method of any one of items 1 to 19.

BRIEF DESCRIPTION OF THE DRAWINGS

In the appended drawings.

Figure 11:
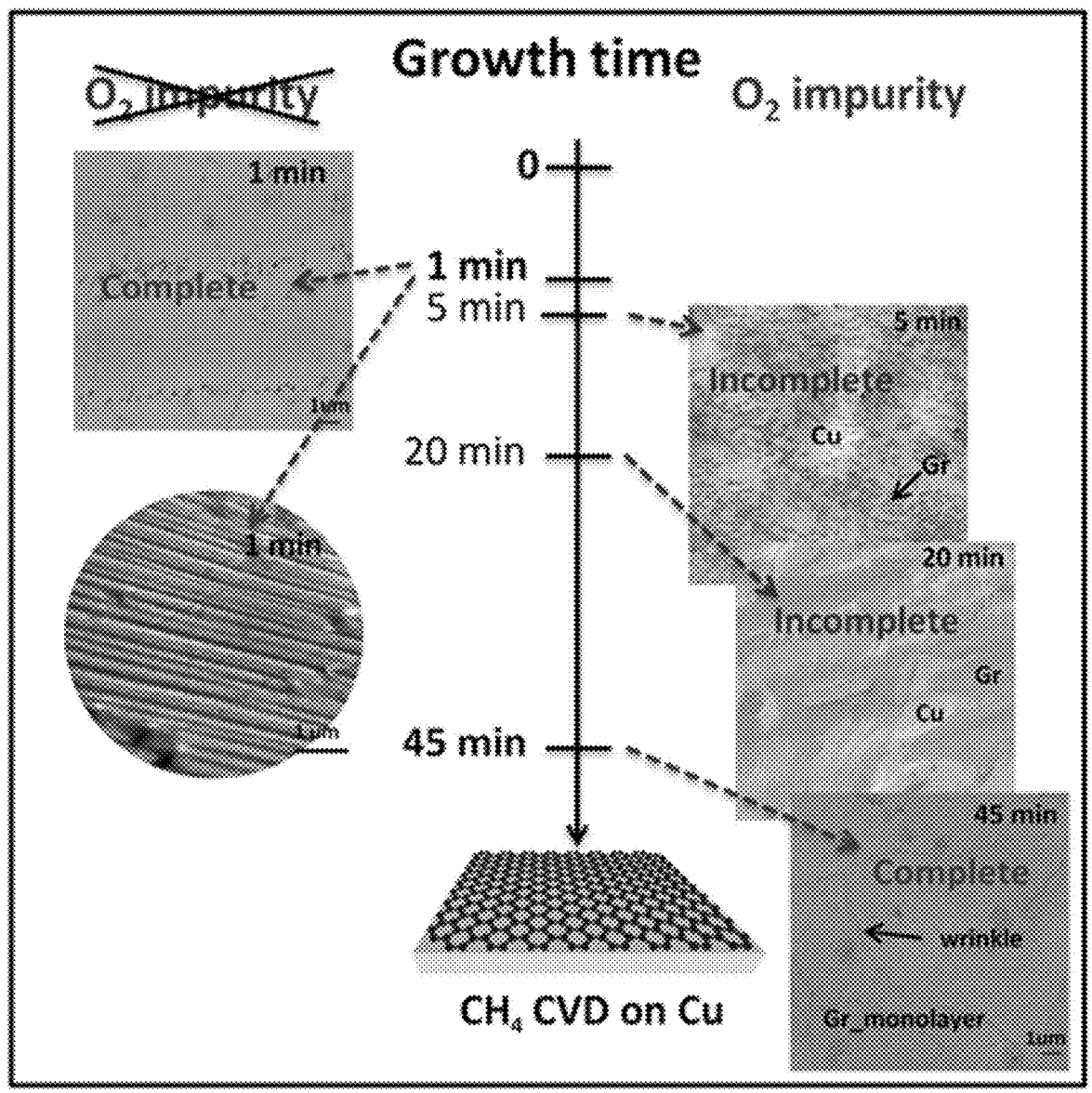
Figure 12:
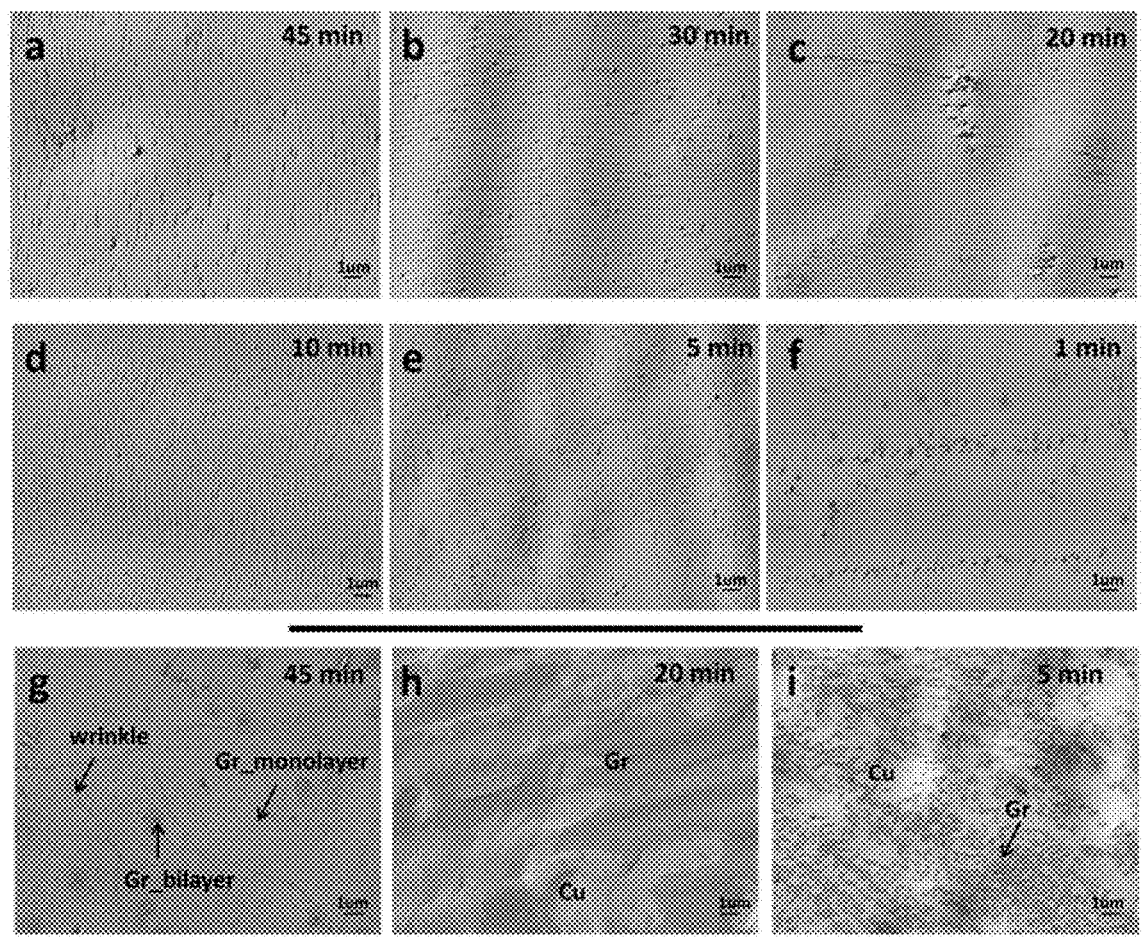
Figure 13:
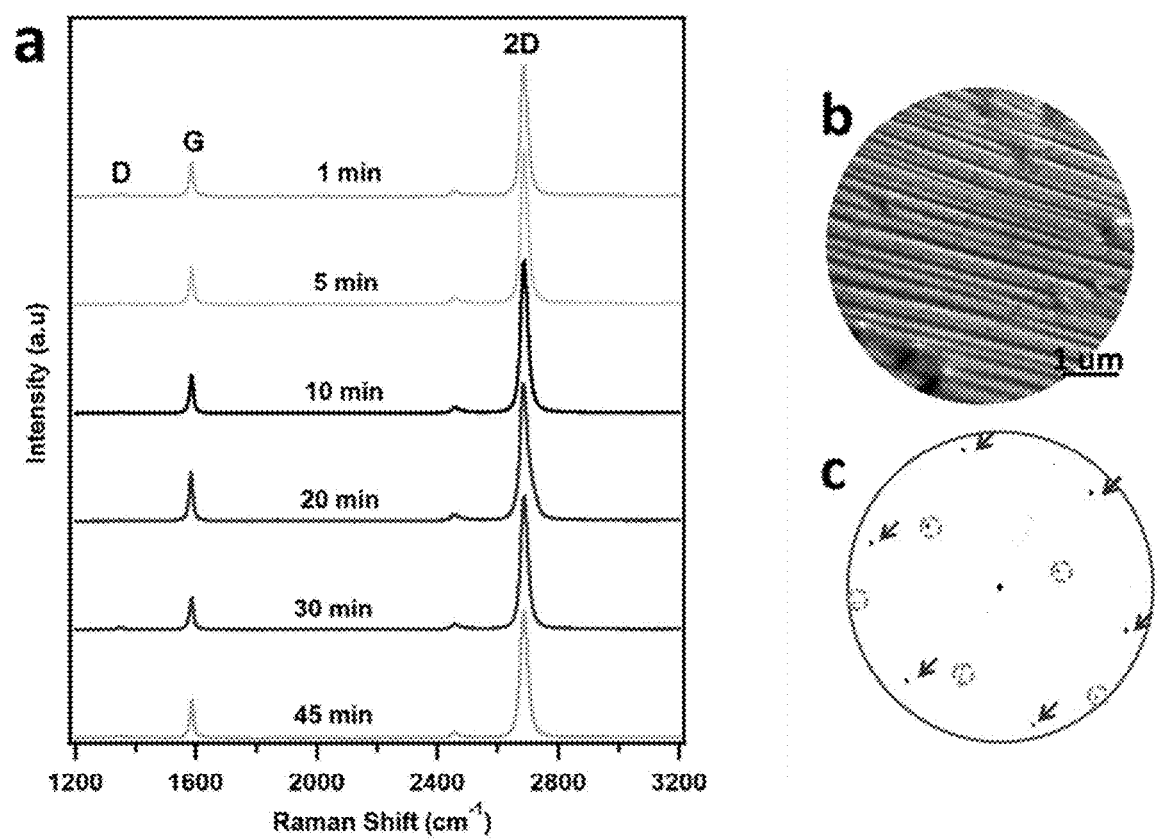

The peak highlighted by an asterisk is an instrument artifact.;

FIG. 11 summarizes the findings reported in Example 2;

FIG. 12 (Example 2) shows SEM images of graphene films grown on copper for different growth times. Purified methane exposure at 1000° C. for a) 45 min, b) 30 min, c) 20 min, d) 10 min, e) 5 min, and f) 1 min, and unpurified methane exposure for g) 45 min, h) 20 min, and i) 5 min;

FIG. 13 (Example 2) shows a) Raman spectra of graphene films grown from purified methane on copper for different growth times after transfer on 100 nm $SiO_2$/Si substrate, b) Bright field Low Energy Electron Microscopy (LEEM) image of the graphene film grown on copper for 1 min (acquired at an incident electron energy of 4.4 eV), and c) Low Energy Electron Diffraction (LEED) pattern acquired at 65 eV in the area depicted in b). The pattern is from a single layer graphene domain. The spots marked by red arrows are from the smooth regions in the LEEM and the shifted spots circled in blue are from the same graphene domain but sitting on the copper facets (darker lines in the LEEM image). A Fast Fourier Transform high pass filter has been applied to the LEED image in order to remove background ascribed to diffuse scattering and secondary electrons; and FIG. 14 (Example 4) shows graphene growth below 1 minute; a) coverages for effective growth times from 10 s to 60 s; b) and c) are SEM images of the 20 s and 42 s effective growth, respectively.

Figure 15:
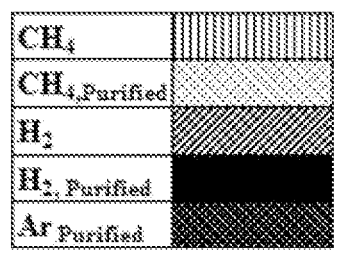

FIG. 15 shows the results of the complete set of experiments reported in the Examples.

DETAILED DESCRIPTION OF THE INVENTION

Turning now to the invention in more details, there is provided a method for growing a graphene coating or carbon nanotubes on a catalytic substrate by chemical vapor deposition.

In its simplest form, this method for growing a graphene coating or carbon nanotubes via chemical vapor deposition comprises the exposition of a catalytic substrate to a carbon-containing gas at a temperature allowing reaction of the carbon-containing gas with the catalytic substrate, thereby producing the graphene coating or the carbon nanotubes on the catalytic substrate.

The method of the invention is useful to grow both graphene coating and carbon nanotubes (CNTs), which, simply are, in fact cylinders made of one or more layers of graphene. In preferred embodiments, the method is a method for growing a graphene coating.

The carbon-containing gas may be any such gas known to the skilled person as adequate for growing graphene coating or carbon nanotubes by CVD. These would include gaseous and/or volatile hydrocarbons, including saturated and unsaturated, acyclic, cyclic and aromatic hydrocarbons (for example: $CH_4$, $C_2H_2$, $C_2H_4$, $C_2H_6$, toluene ($C_7H_8$), benzene ($C_6H_6$), and generally $C_xH_y$, wherein x varies from 1 to 20 and y≤2x−2) as well as volatile alcohols (such as methanol, ethanol, propanol, etc.). In preferred embodiments, the carbon-containing gas is $CH_4$ (methane).

The catalytic substrate may be any catalytic substrate known to the skilled person as adequate for growth by CVD of graphene coatings and carbon nanotubes.

For the growth of graphene coatings, these catalytic substrates would include metals with low carbon solubility and surface mediated growth; for example, Cu, Au, Ni—Au and Cu—Ni Metal Alloys, and the semiconductor Ge. This would also include metals with bulk mediated growth such as Ni, Pt, Ru, Ir, W, Pd, and Co. In preferred embodiments, the catalytic substrate for the growth of graphene coatings is copper (Cu) or Cu—Ni alloys. In these cases, the catalytic substrates can be of any shape and will become coated with the graphene coating.

For carbon nanotubes, the catalytic substrates will typically be in the form of particles, for example nanoparticles, of the size of the CNT diameter to be grown. The carbon nanotubes will indeed grow away from these particles. Typically, these catalytic substrates would include metals with surface mediated growth, preferably with a somewhat higher carbon solubility. Non-limiting examples of such substrates include nickel, cobalt, iron, gold, copper, silver, platinum, palladium and silicon oxide or a combination thereof. In preferred embodiments, the catalytic substrate for the growth of carbon nanotubes is nickel, cobalt or iron or a combination thereof.

CVD systems can be classified according to the temperature of the various parts of the system. In "cold wall" systems, only the catalytic substrate is heated. In "hot wall" systems, the whole furnace (containing the catalytic substrate) is heated. Thus, in hot wall systems, the gases are heated at the catalytic substrate temperature while in cold wall systems, the gases are at roughly room temperature. Both "hot wall" systems and "cold wall" systems are useful for the growth of graphene coatings and carbon nanotubes and are part of the present invention. In preferred embodiments of the invention, a hot wall system is used.

Figure 1:
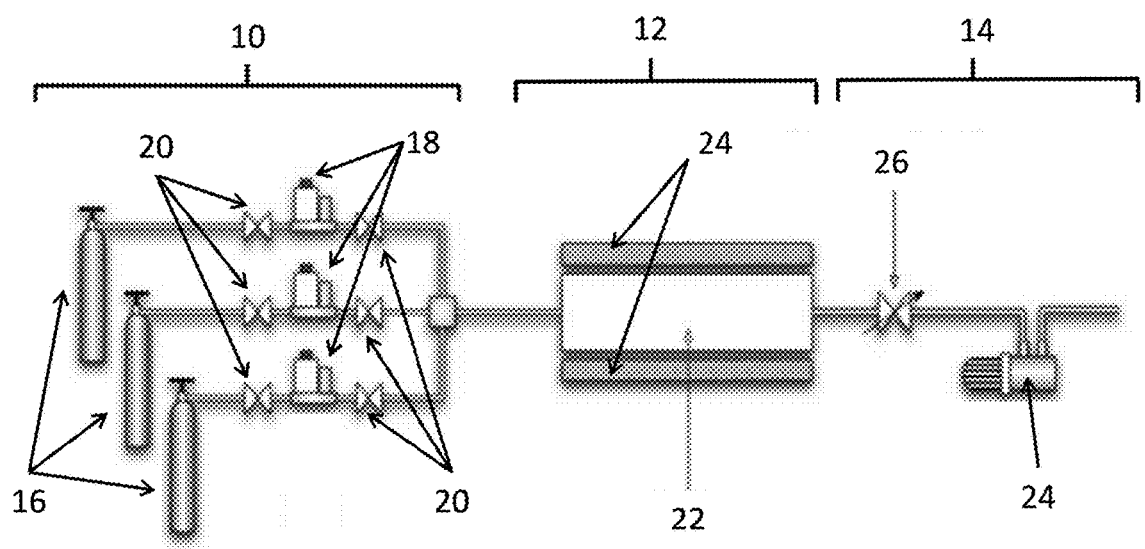
FIG. 1 is a schematic diagram of a tube furnace CVD system.

Typical CVD systems are generally composed of three parts: a gas delivery system (10), a furnace (12) and a gas removal system (14). FIG. 1 shows a typical hot wall CVD system for growth of graphene coatings and carbon nanotubes using a tube-furnace (12). The setup first comprises a gas delivery system (10) for the introduction of gases from gas bottles (16) into the furnace (12). The flow of the various gases can be monitored and controlled by mass flow rate controllers (18) or by pressure and leak valves (20). Then, furnace (12) comprises a reactor (22) where reactions occur and the graphene coatings and carbon nanotubes are grown, Heaters (24) surround the reactor to provide high temperature for reaction. They are monitored by thermocouples located on the heaters. Finally, the gas removal system (14) is composed of a vacuum pump (24) and a pressure control valve (26) to remove excess gas from the CVD reactor.

In CVD deposition of graphene coatings and carbon nanotubes, and more specifically graphene coatings, the deposition process includes two types of reactions: gas phase reaction in the case of AP-CVD and surface reactions on/close to the heated catalytic substrate surface leading to the formation of the graphene coating (e.g. graphene film) [R. Munoz, C. Gomez-Aleixandre, "Review of CVD Synthesis of Graphene," Chem. Vap. Deposition, 19, 297-322, 2013; S. Bhaviripudi, X. T. Jia, M. S. Dresselhaus, and J. Kong, "Role of Kinetic Factors in Chemical Vapor Deposition Synthesis of Uniform Large Area Graphene Using Copper Catalyst," Nano Lett., 10, 4128-4133, 2010.].

Figure 2:
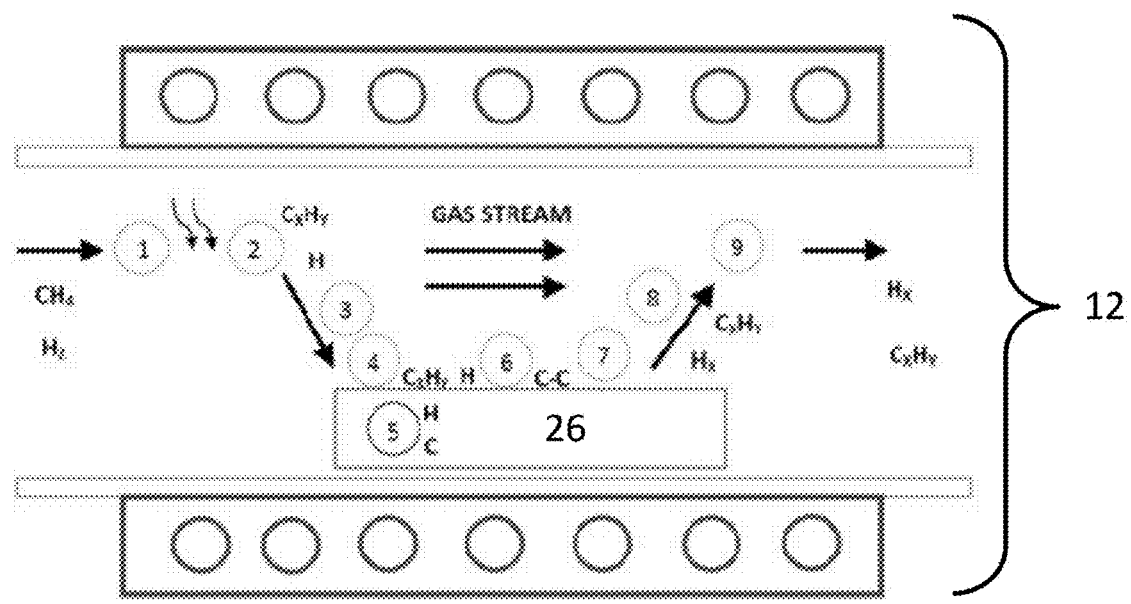
FIG. 2 is a schematic diagram of thermal CVD for graphene deposition from CH$_4$/H$_2$ mixtures.

A schematic diagram of the typical CVD processes involved during the growth of graphene from $CH_4/H_2$ mixtures is shown in FIG. 2. This figure shows the catalytic substrate (26) in a furnace (12) viewed in cross-section. Steps 1 through 9, as illustrated in FIG. 2 are:

1. Transport of reactants.
2. Thermal activation. Homogeneous gas reaction with particles and powder production should be avoided in graphene synthesis, controlling the kinetic parameters (pressure (P), temperature (T), and concentration (n)).

3. Transport of reactants by gas diffusion from the main gas stream through the boundary layer.
4. Adsorption of reactants on the catalytic substrate surface.
5. Dissolution and bulk diffusion of species depending on the solubility and physical properties of the catalytic substrate.
6. Thermal activation-mediated-surface processes, including chemical decomposition (catalytic), reaction, surface migration to attachment sites (such as atomic-level steps), incorporation, and other heterogeneous surface reactions. Growth of the film.
7. Desorption of by-products from the surface.
8. Transport of by-products by diffusion through the boundary layer and back to the main gas stream.
9. Transport of by-products by forced convection away from the deposition region Adapted from R. Munoz, C. Gomez-Aleixandre, "Review of CVD Synthesis of Graphene," *Chem. Vap. Deposition*, 19, 297-322, 2013.

As discussed above, the literature on CVD of graphene contain many inconsistencies. In fact, nominally identical conditions seem to produce different results. Based on the results reported in the Examples below, the present inventors attribute these inconsistencies to the presence of oxidizing species (impurities) in the CVD systems used. In fact, the present inventors believe that the wide range of reported growth conditions in this increasingly abundant literature is linked to the presence of oxidizing species in the CVD chamber before, during, and/or after growth.

Oxidizing species that can be found in CVD systems typically include for example $O_2$, $O_3$, $CO_2$, $NO_2$, $H_2O_2$, $F_2$, and $Cl_2$. These oxidizing species can originate from the gas feedstock used, from air leaks into the furnace, and from the catalytic substrate itself. The most common oxidizing species is $O_2$.

As shown in the Examples below, these oxidizing species significantly and deleteriously impact graphene growth by altering the balance between growth and etching (they favor etching), but their action can be counteracted using reducing species. The present inventors expect that these teachings will apply to the growth of carbon nanotubes by CVD.

The present invention therefore relates to a method of growing graphene coatings and carbon nanotubes on a catalytic substrate by chemical vapor deposition in an atmosphere in which the ratio of oxidizing species to reducing species is controlled. This ratio can be expressed as $$\frac{P_{ox}}{P_{red}},$$

wherein $P_{ox}$ is the partial pressure oxidizing species and $P_{red}$ is the partial pressure of reducing species in the atmosphere. More specifically, the inventors have found that when $$\frac{P_{ox}}{P_{red}} = 5 \times 10^{-6},$$

the growth rate is about 50% of its theoretical maximum value. At $$\frac{P_{ox}}{P_{red}} = 5 \times 10^{-8},$$

the growth rate reaches 99% of its maximum theoretical value. Therefore, in the method of the present invention, the CVD of the graphene coatings and carbon nanotubes is carried out in an atmosphere in which $$\frac{P_{ox}}{P_{red}} \leq 5 \times 10^{-6},$$

preferably $$\frac{P_{ox}}{P_{red}} \leq 5 \times 10^{-7},$$

and more preferably $$\frac{P_{ox}}{P_{red}} \leq 5 \times 10^{-8}.$$

The above ratio can be achieved in two ways, which can be applied separately or concurrently:
 the content of oxidizing species in the atmosphere in the CVD furnace can be reduced (i.e. CVD can be carried out in an atmosphere having a reduced content of oxidizing species) and
 the action of the oxidizing species that are present in the CVD furnace can be counteracted by introducing reducing species in the CVD furnace.

An "atmosphere having a reduced content of oxidizing species" is an atmosphere containing less oxidizing species than the atmosphere typically used for CVD of graphene coatings and carbon nanotubes. This typical atmosphere generally comprises between about 100 ppm and about 10 ppm of oxidizing species. Therefore, an atmosphere having a reduced content of oxidizing species comprises about 5 ppm or less, preferably 1 ppm or less, more preferably about 100 ppb or less, more preferably about 10 ppb or less, more preferably about 1 ppb or less of oxidizing species.

The skilled person will readily understand that, in practice, it is very difficult to completely eliminate oxidizing species during CVD. Therefore, it is quite advantageous that for a given level of oxidizing species, adding (or increasing the partial pressure of) reducing species in the CVD furnace will counteract the deleterious action of the oxidizing species. Herein a reducing species is species that reacts with, and reduces oxygen and/or oxidized carbon species in the CVD furnace. The use of reducing species is especially useful when the concentration in oxidizing species is in the higher end of the above range, i.e. about 5 ppm or more. Non-limiting examples of reducing species (gaseous or volatile) include $H_2$, $NH_3$, CO, $CH_4$, $H_2O$, ethanol and other alcohols. A preferred reducing species is $H_2$.

The following calculation—based on standard LP-CVD systems for graphene coating—is presented to illustrate this point.

A standard LP-CVD system with a $10^{-6}$ Torr base pressure requires a minimum of 40 mTorr of pure $H_2$ (a reducing species) simply to compensate for oxygen leaks into the furnace. This is because the oxygen base pressure is roughly $2 \times 10^{-7}$ Torr (note: 20% $O_2$ in air). The standard UHP grade $H_2$ (typically used in LP-CVD of graphene) comprises up to 2 ppm of $O_2$ and the standard UHP $CH_4$ feedstock most typically used for CVD comprises up to 15 ppm of $O_2$.

All the above leads to a ratio $$\frac{P_{O_2}}{P_{H_2}} \cong 1 \times 10^{-4} \text{ using } P_{H_2} = 0.05 \text{ Torr and } P_{CH_4} = 0.5 \text{ Torr.}$$

Without further purification of the gases involved, only 3% of maximum growth rate can be reached in these conditions.

In these conditions, to increase the growth rate to 50% of the maximum growth rate, the hydrogen partial pressure would have to be increased to at least 1.5 Torr of pure $H_2$.

Thus, to compensate for the presence of oxidizing species in this typical case, the partial pressure of pure $H_2$ (i.e. without $O_2$ or with a very reduced $O_2$ content) should be at least three times higher than that of $CH_4$ and even more (3 Torr) when $O_2$-containing $H_2$ (i.e. regular UHP $H_2$ with 2 ppm $O_2$) is used. It should be noted that for an $O_2$ level higher than 5 ppm in $H_2$, the 50% of the maximum growth rate cannot be reached for any level of $H_2$.

It should also be noted that there is a theoretical limit beyond which the partial pressure of the reducing species cannot be increased without hindering the reactive sites of the catalytic substrate and hence slow down growth. Therefore, it may not simply be sufficient to use more reducing species in a prior art setup with a very high content of oxidizing species. Rather, it may be necessary to reduce the content in oxidizing species in the gas feedstock used. Then the effect of the remaining (more or less unavoidable) oxidizing species may be counteracted using reductive species.

The minimal partial pressure of the reducing species to be used will depend on the partial pressure of oxidizing species in the CVD furnace. (As noted above, part of these oxidizing species may be contained as impurities in the reducing species gas itself, which must be taken into account). The skilled person can calculate the minimal partial pressure for a standard LP-CVD furnace using the partial pressure of oxidizing species and the above $$\frac{P_{ox}}{P_{red}}$$

ratio. Generally speaking, the partial pressure of the reducing species may be between about 40 mTorr and about 100 Torr, preferably between about 40 mTorr and about 1 Torr.

On the other hand, to obtain an atmosphere having a reduced content of oxidizing species, the gas feedstock used (the carbon-containing gas and the reducing species when present), should not contain a high content of oxidizing species. In embodiments, the gas feedstock is thus purified to decrease its content in oxidizing species to about 1 ppm or less, preferably 100 ppb or less, more preferably 10 ppb or less, and yet more preferably 1 ppb or less.

In embodiments, highly purified commercially available gas feedstock can be used. This however can be quite expensive.

In other embodiments, standard gas feedstock can be purified using gas purifiers. In such embodiments, the gas purifier may be simply installed on the gas line between the gas source (i.e. a bottle of gas or an institutional gas line) and the CVD furnace. Purifiers can be readily obtained from commercial sources. Non-limiting examples of purifiers include DEOXO™ ($O_2$<1 ppb) to purify $H_2$ and SAES Pure Gas Inc. MC1-950FV ($H_2O$ and $O_2$<1 ppbV) to purify $CH_4$. Other gas purifiers include MC1-902FV ($H_2O$ and $O_2$<1 ppbV) for Ar, and MC1-804FV ($H_2O$ and $O_2$<1 ppbV) for $CO_2$. In fact, SAES Pure Gas Inc. has a large inventory of proprietary purifiers usable for most gases.

In other embodiments, freeze/thaw cycles can be used to purify most liquid carbon-containing gases from ambient gases (such as $)_2$, $N_2$, and $CO_2$).

In yet other embodiments, palladium membrane diffusion purification may be used to purify $H_2$. For example, that originally commercialized by Johnson Matthey produced the highest known level of purification for $H_2$ (up to 9N).

In view of the above, it will be apparent to the skilled person that, in all cases, air leaks into the CVD furnace should preferably be kept to a minimum.

As shown in the Examples below, the unexpected advantages of carrying out graphene CVD in an atmosphere in which the ratio of oxidizing species to reducing species is controlled include:
faster growth rates,
continuous films (films without holes—which are generally due to etching),
films of higher quality, and
increased control and reproducibility of graphene growth.

Indeed, in the Examples below, the present inventors report the growth of continuous, high quality graphene coatings in a very short time. Films were obtained in less than 5 minutes, less than 4 minutes, less than 3 minutes, less than 2 minutes and in about 1 minute, or even in 1 minute or less. In fact, a substrate coverage higher than 90% was observed at 10 seconds and reached nominally 99% at 30 seconds. At this point, some domain boundary holes may remain, but will fuse together to reach completion before about 1-minute growth time. In addition, in some circumstances, as described below, the method of the invention also allows obtaining monolayers of graphene. The present inventors believe that the similar advantages will be achieved when growing carbon nanotubes.

In embodiments, the present invention may have one of more of the following advantages. The installation of gas purifiers is entirely compatible with industrial manufacturing processes and is beneficial as it can lower production cost by reducing process time and saving energy. The method of the invention is expected to be suitable for large scale manufacturing. It could thereby open the door to viable synthesis of graphene materials and carbon nanotubes in an energy- and cost-saving manner.

In more specific embodiments of the method of the invention, the method of growing a graphene coating or carbon nanotubes on a catalytic substrate by chemical vapor deposition comprises the steps of:
a) heating said catalytic substrate at a growth temperature in a CVD furnace,
b) exposing the catalytic substrate heated at said growth temperature to a gaseous atmosphere, for example a gaseous flow, of a carbon-containing gas, thereby growing the graphene coating or the carbon nanotubes on the catalytic substrate, and
c) cooling said catalytic substrate down to a temperature at which etching of the graphene coating or the carbon nanotubes by oxidizing species does not occur,
wherein steps b) and c), and preferably all of steps a), b), and c), are carried out in an atmosphere in which the ratio of oxidizing species to reducing species is controlled. This control being as defined above and being effected as described above.

Preferably, at the end of step a), the temperature of the catalytic substrate is stable before proceeding with step b).

In embodiments, the method of the invention further comprise before step a), an annealing step comprising heating the catalytic substrate at an annealing temperature and annealing the catalytic substrate at said annealing temperature. During this step, the catalytic substrate is maintained at the annealing temperature for a few minutes up to 60 minutes or more. For example, copper foils to be used as catalytic substrates for deposition will generally be annealed for about 30 minutes. This step is useful, for example, when Cu foils are covered with native oxide (CuO, $Cu_2O$), which suppresses their surface catalytic activity. To facilitate growth, the Cu catalytic substrate can be annealed before growth in a hydrogen reducing atmosphere. Annealing at a temperature above 400° C. allows desirably reducing the copper surface. Annealing at a temperature above 950° C. however causes the copper to recrystallize. The annealing step prior to growth is also advantageous because it increases the Cu grain size and rearranges its surface morphology, such as introduction of atomic steps and elimination of surface structural defects. These changes lead to larger copper grain sizes and ultimately larger domains in the case of graphene coatings. Of note, this annealing step is not recommended when growing carbon nanotubes as it may lead to particle ripening.

In embodiments, steps a), c) and the annealing step can be performed under vacuum.

In preferred embodiments however, any, all, some, and any subset of the steps of the above method is carried out under a gaseous atmosphere, for example under a gaseous flow. This gaseous atmosphere/flow can comprise the carbon-containing gas, a reducing species and/or an inert species. In more preferred embodiments, for any, all, some, and any subset of the steps of the method, a gaseous flow is preferred to a static gaseous atmosphere. The presence of a gaseous flow in the furnace (rather than a static gaseous atmosphere) is advantageous because it reduces or dilutes air leaks in the furnace. Also, as an added benefit, the presence of a gaseous flow in the furnace during step a) and/or the annealing step purges residual air from the furnace and removes oxidizing species that may be on the catalytic substrate.

Of course, during step b), a gaseous atmosphere/flow of the carbon-containing gas is necessarily present as growth of a graphene coating or carbon nanotubes is desired. A gaseous atmosphere/flow of the carbon-containing gas may also be used in the other steps [i.e. a), c) and the annealing step]. However, this is not preferred.

In fact, in preferred embodiments, the cooling step (step c)) is carried out in the absence of the carbon-containing gas. In such embodiments, after step b), the flow of carbon-containing gas in the furnace, if any, is interrupted and the carbon-containing gas is evacuated from the furnace, for example using a vacuum or, preferably, a flow of reducing species or inert species. Then, step c) is carried out. As shown in the Examples below, carrying out the cooling step (step c)) in the absence of carbon-containing gas has the unexpected advantage of producing single monolayers of graphene, rather than the bi- and multi-layers observed when the carbon-containing gas is present during cooling. As for carbon nanotubes, this step avoids the undesired growth of further structures after the growth step (step b)).

Furthermore, in preferred embodiments, step a) and/or the annealing step (if present) are also carried out in the absence of the carbon-containing gas. The absence of the carbon-containing gas in these steps provides a better control of the growth. Indeed, growth can otherwise start during step a) and the annealing step, once a temperature allowing decomposition of the carbon-containing gas is reached.

Alternatively or concurrently to the above, in any, all, some, and any subset of the steps, the gaseous atmosphere/flow may comprise a reducing species. As explained above, the effect of oxidizing species can be counteracted using one or more reducing species. Thus, in embodiments, any one of steps a), b), c), and the annealing step or any subset of steps a), b), c), and the annealing step, preferably steps b) and c) or all of steps a), b), c), and the annealing step (if present) are carried out under a gaseous atmosphere/flow of a reducing species.

Alternatively or concurrently to the above, in any, all, some, and any subset of the steps, the gaseous atmosphere/flow may comprise an inert species. Such inert species replaces vacuum in AP-CVD. It is also a carrier gas and can help pumping other gases. Non-limiting examples of inert species include Ar and the other noble gases. Of note, oxidizing species may be contained as impurities in the inert species gas itself (as received). Therefore, in embodiment, this gas is purified before being used. This purification is as described above for the carbon-containing gas and the reducing species. Thus, in embodiments, any one of steps a), b), c), and the annealing step or any subset of steps a), b), c), and the annealing step, preferably steps a) and the annealing step (if present), are carried out under a gaseous atmosphere/flow of an inert species.

It should be noted that some carbon-containing gases can also be reducing species. Non-limiting examples include methane, carbon monoxide, and ethanol. Thus, they can be used to counteract the action of the oxidizing species. However, as noted above, their use is not preferred in steps a), c) and the annealing step (if present).

It should also be noted that, during step b), various reducing species may be used in mixture with the carbon-containing gas for intentional doping of the graphene coating or carbon nanotubes.

During the heating step (step a)), the catalytic substrate is heated to a growth temperature allowing the carbon-containing gas to react with the catalytic substrate, thereby producing with the graphene coating or the carbon nanotubes. Further, heating in this step allows the catalytic substrate to degas. The growth temperature will depend on the nature of the catalytic substrate and the carbon-containing gas. Generally, this temperature will be between about 400 and about 1400° C., for graphene, preferably above 980 and more preferably above 1000° C. More specifically, for graphene on a copper substrate, the growth temperature is preferably between about 750 and about 1050° C., more preferably between about 900 and about 1050° C. and yet more preferably between about 1000 and about 1050° C., which leads to faster growth and higher coating quality. With regard to carbon nanotubes, preferred growth temperatures are lower, ranging from about 550 to about 700° C.

For graphene, the heating rate is not particularly limited as it does not significantly impact the present method. Generally, it should not be so low as to make the method too long to perform and should not be so high as to cause crystal dislocation (which will depend on the nature of the catalytic substrate). Generally speaking, the heating rate may vary, for example, from about 0.01 to about 1000° C./s, preferably between about 0.01 and about 10° C./s, more preferably between about 0.01 and about 1° C./s, and yet more preferably, it is about 0.1° C./s.

For carbon nanotubes, a faster heating rate, typically between about 10 to about 1000° C./s, is desirable to avoid/reduce nanoparticles catalyst ripening.

For some substrate/carbon-containing gas combinations, a gas reducing catalyst or getter can be used as known in the art. In the case of graphene coatings, catalysts and getters can be located in a gas line or in the growth chamber or used as a sample holder. For example, thermally activated getters/purifiers can be used in proximity of the catalyst in cold wall furnace and be heated together with the catalyst to remove desorbing gases. Non-limiting examples of catalysts include platinum, palladium, and titanium. Non-limiting examples of getters include cobalt and proprietary getter, such as those sold by the company SAES.

During step b), the carbon-containing gas comes into contact with the catalytic substrate surface, reacts with the catalytic substrate, which results in the growth of the graphene coating or carbon nanotubes. As noted above, because this is carried out in an atmosphere in which the ratio of oxidizing species to reducing species is controlled, this growth is very fast. Therefore, in embodiments, step b) last about 5, 4, or 3 minutes or less, preferably 2 minutes or less, for example about 1 minute, or even 1 minute or less, and nevertheless yield a coating that is hole-free or nearly hole-free (holes are generally due to etching, which is minimized in the method of the invention) and thus entirely or nearly entirely covers the surface of the catalytic substrate that is exposed to the carbon-containing gas.

During step b), the partial pressure of the carbon-containing gas will be adjusted according to the desired growth speed. For a given ratio $$\frac{P_{ox}}{P_{red}},$$

growth speed will be directly proportional to precursor pressure. Generally, the coating grain size should decrease with increasing precursor partial pressure. The partial pressure of the carbon-containing gas may be between about $10^{-8}$ Torr and about 1000 Torr, preferably between about $10^{-3}$ Torr and about 40 Torr.

During the cooling step (step c)), the catalytic substrate is cooled down at a temperature at which etching of the graphene coating or carbon nanotubes by oxidizing species does not occur. The minimum temperature at which such etching does not occur will depend on the nature of the catalytic substrate and the carbon-containing gas. Generally, this temperature may be about 600° C. or less. Of course, the catalytic substrate may be directly cooled down at about room temperature. In embodiments, however, it will first be cooled at a higher temperature (at which etching nevertheless does not occur), then one or more optional processes will be carried out, and then the catalytic substrate will be further cooled to about room temperature. Non-limiting examples of optional processes that may be carried out at this point include doping, cleaning processes and polymer deposition.

The cooling rate is not particularly limited. In general, it may vary from about 0.001 to about 1000° C./s, preferably between about 0.01 and about 10° C./s, more preferably between about 0.01 and about 1° C./s. In preferred embodiments, the cooling rate is preferably quite slow, for example about 0.2° C./s, for the first 50° C. of cooling down where reaction kinetics are slow compared to growth conditions. In alternative embodiments, in some setups, the coated substrate can be taken out of the furnace very quickly, which is also beneficial.

In another aspect of the invention, there is provided a catalytic substrate coated with a graphene coating grown according to the method described above. In preferred, embodiment, the graphene coating is a hole-free graphene monolayer. In embodiments, this monolayer is free of bi- or multi-layer domains.

Definitions

Herein, "ppm" means part-per-million by volume (or mole basis); "ppb" means part-per-billon by volume (or mole basis); they can be used interchangeably with ppmV and ppbV respectively, which have the same definition.

The use of the terms "a" and "an" and "the" and similar referents in the context of describing the invention (especially in the context of the following claims) are to be construed to cover both the singular and the plural, unless otherwise indicated herein or clearly contradicted by context.

The terms "comprising", "having", "including", and "containing" are to be construed as open-ended terms (i.e., meaning "including, but not limited to") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. All subsets of values within the ranges are also incorporated into the specification as if they were individually recited herein.

Similarly, herein a general chemical structure with various substituents and various radicals enumerated for these substituents is intended to serve as a shorthand method of referring individually to each and every molecule obtained by the combination of any of the radicals for any of the substituents. Each individual molecule is incorporated into the specification as if it were individually recited herein. Further, all subsets of molecules within the general chemical structures are also incorporated into the specification as if they were individually recited herein.

All methods described herein can be performed in any suitable order unless otherwise indicated herein or otherwise clearly contradicted by context.

The use of any and all examples, or exemplary language (e.g., "such as") provided herein, is intended merely to better illuminate the invention and does not pose a limitation on the scope of the invention unless otherwise claimed.

No language in the specification should be construed as indicating any non-claimed element as essential to the practice of the invention.

Herein, the term "about" has its ordinary meaning. In embodiments, it may mean plus or minus 10% or plus or minus 5% of the numerical value qualified.

Unless otherwise defined, all technical and scientific terms used herein have the same meaning as commonly understood by one of ordinary skill in the art to which this invention belongs.

Other objects, advantages and features of the present invention will become more apparent upon reading of the following non-restrictive description of specific embodiments thereof, given by way of example only with reference to the accompanying drawings.

DESCRIPTION OF ILLUSTRATIVE EMBODIMENTS

The present invention is illustrated in further details by the following non-limiting examples.

EXAMPLE 1

Graphene CVD: Interplay Between Growth and Etching on Morphology and Stacking by Hydrogen and Oxidizing Impurities 1. Introduction We report herein the results of experiments designed for clarifying the role of $H_2$ and oxidizing impurities during graphene growth from $CH_4$ on copper foils at 500 mTorr pressure and at high temperature (in the 950-1000° C. range). Taking advantage of gas purifiers, we designed a series of experiments to decouple the role of oxidizing impurities, methane, argon, and hydrogen during the growth and post-growth process steps.

We first show that high purity molecular hydrogen does not etch graphene films on copper even at the growth temperature of 950° C.

Further, for extremely low levels of oxidizing impurities, the presence of $H_2$ is not required for growing high quality graphene layers. That is, continuous and uniform graphene films were successfully grown using solely purified $CH_4$ ($O_2$<1 ppbV), which serves a double role as a copper oxide reducer and carbon supply for growth. Films grown under high purity conditions (low level of oxidizing impurities) exhibit a higher bilayer and multilayer coverage; these bi- and multi-layer graphene islands are twisted with respect to the first graphene layer as revealed by hyperspectral Raman imaging.

Under standard conditions (unpurified gases), however, a flow of $CH_4/H_2$ was necessary during cooling for preventing etching.

Following the growth stage, the graphene films can be protected from the detrimental effect of oxygen in the absence of $CH_4$ by flowing purified UHP $H_2$ during cooling.

Figure 3:
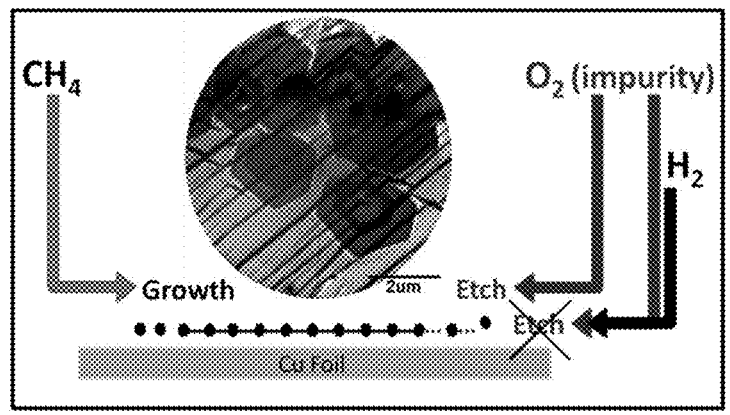
FIG. 3 is a schematic showing the competitive action between oxidative etching and carbon growth.

These results reveal a competitive action between oxidative etching and carbon growth, which balance, for a given $CH_4/H_2$ ratio, depends on the partial pressures of oxidative impurities in the gas feedstock. This phenomenon is illustrated in FIG. 3.

Our study confirms the etching effect of oxidizing impurities introduced from as-received gas bottles and by leaks at high temperature, and establishes their determining role for the optimum conditions of graphene low-pressure CVD (LPCVD). They also demonstrate that oxidizing impurities are responsible for the observed graphene etching and that the primary role of hydrogen is to suppress and counterbalance this etching reaction.

Our results provide new fundamental insights on the graphene CVD growth, highlighting the role of hydrogen and its controlling influence on the action of oxidizing impurities on nucleation and etching during the growth process.

2. Experimental Details 2.1 Graphene Growth

Graphene films were grown on 25-μm-thick Cu foils (Alfa Aesar, item no. 13382) at 950-1000° C. in a 3.8-cm diameter (1.5 inch.) fused quartz tube inside a horizontal furnace (Lindberg/Blue M, Thermo Scientific) under low pressure conditions using $H_2/CH_4$, purified UHP $H_2$/unpurified $CH_4$, and purified Ar/$CH_4$ gas mixture, as well as unpurified $CH_4$ and purified $CH_4$ gas. The system was equipped with a manifold capable of ultra-high vacuum (UHV) conditions. Prior to each growth, the system was evacuated to a vacuum of $5 \times 10^{-6}$ Torr using a turbo molecular pump. The copper foils were then heated to 1000° C. and annealed at this temperature for 30 min under the flow, at 50 mTorr, of the specific gas used in each recipe. Then, growth was carried out at temperatures between 950 and 1000° C. for 45 min. with the reactor pressure maintained at 500 mTorr. Finally, the chamber was cooled down to room temperature, which took about 100 minutes.

The Cu foils were chemically cleaned in 1 M acetic acid (Sigma Aldrich, Reagent Plus>99%) at 60° C. followed by acetone and then 2-propanol (without drying) for 10 min in each step. The Cu substrates were then blown-dried with nitrogen.

We selected purifiers that allowed decreasing the residual $O_2$ content in UHP gases to less than 1 ppb: (i) For $H_2$ (Praxair, UHP, grade 5, $O_2$<1 ppm), we used DEOXO™ ($O_2$<1 ppb), (ii) for $CH_4$ (Praxair, UHP, grade 3.7, $O_2$<15 ppm), we used SAES Pure Gas Inc. MC1-950FV ($H_2O$ and $O_2$<1 ppbV), and (iii) for Ar (Alfagaz, UHP, grade 2, $O_2$<1 ppm), we used SAES Pure Gas Inc. MC1-902FV ($H_2O$ and $O_2$<1 ppbV). In order to carefully control the growth experiments, the purifiers were installed on the same gas bottles with which experiments with as-received gases were conducted.

2.2 Graphene Annealing

To allow comparison with the recent literature, graphene layers were also grown using unpurified 450 mTorr $CH_4$ and 50 mTorr $H_2$ at 1000° C. The sample cleaning and growth procedures were those described in section 2.1. This procedure yielded continuous and uniform films.

The as-grown films were analyzed by scanning electron microscopy (SEM) to verify that they were complete graphene layers. The samples were then placed inside the CVD chamber for the annealing experiments. The chamber was pumped down to $5 \times 10^{-6}$ Torr. Samples were then exposed to a flow of either as-received or purified UHP hydrogen at 950° C. for 30 minutes maintaining a system pressure of 500 mTorr during the process. The morphology of each annealed graphene sample was examined using SEM and, in some cases, low-energy electron microscopy (LEEM).

2.3 Graphene Transfer

Graphene layers were transferred onto $SiO_2$ (100-nm-thick)/Si wafers by the commonly used method based on poly-methyl methacrylate (PMMA) support [J. W. Suk, A. Kitt, C. W. Magnuson, Y. F. Hao, S. Ahmed, J. H. An, A. K. Swan, B. B. Goldberg, and R. S. Ruoff, "Transfer of CVD-Grown Monolayer Graphene onto Arbitrary Substrates," *Acs Nano*, vol. 5, pp. 6916-6924, September 2011]. First, a PMMA (M.W. 15000 GPC, Acros organics, 4% in chlorobenzene) layer was spin-coated at 4000 rpm for 30 sec over the front side of the graphene/copper sample and dried in air at room temperature for 1 hour. After protecting the top graphene layer with PMMA, graphene grown on the back face was removed using an oxygen plasma (100 W for 1 min). The copper foil was then etched by immersing the copper-graphene-PMMA stack in 0.1 M aqueous ammonium persulfate (Reagent, ACS 98+%, Acros Organics). After complete Cu removal, the floating PMMA/graphene film was rinsed in deionised water, transferred onto a $SiO_2$/Si substrate, and dried in vacuum at room temperature for approximately 1 hour. Finally, the PMMA was dissolved in acetone, and the sample was rinsed in isopropyl alcohol and blown-dried with nitrogen.

2.4 Characterization

Electron Microscopy:

SEM was carried out using a Hitachi S-4700 microscope operated at 1 kV. Low Energy Electron Microscopy (LEEM)

was performed at 2.4 eV kinetic energy in the UHV chamber (base pressure $4 \times 10^{-10}$ mbar) using a FE-LEEM P90 from SPECS-GmbH.

Raman Spectroscopy and Imaging:

Raman microspectroscopy measurements were performed at room temperature with a Renishaw Invia spectrometer with a laser wavelength of 514 nm. A 50× objective (N.A=0.55) focuses a 4 mW laser beam to a probe spot about 1 μm in diameter. Raman imaging was carried out using a hyperspectral Raman imager RIMA™ based on a Bragg Tunable Filter (BTF) technology [S. Marcet, M. Verhaegen, S. Blais-Ouellette, and R. Martel, "Raman spectroscopy hyperspectral imager based on Bragg tunable filters," 2012, pp. 84121J-84121J-7]. In these measurements, a continuous wave (cw) laser line at λ=532 nm illuminates a 100×100 $\mu m^2$ sample surface area through a 100× microscope objective (N.A=0.9). In this configuration, the sample was excited with a fluence of 150 $\mu W.\mu m^{-2}$, the acquisition time is 120 sec per frame and the resolution is diffraction limited.

3. Results 3.1 Graphene Annealing

We conducted annealing studies to investigate the effects of $H_2$ and oxidizing impurities at 950° C., i.e. a temperature value within the range of typical graphene growth temperatures.

Figure 4:
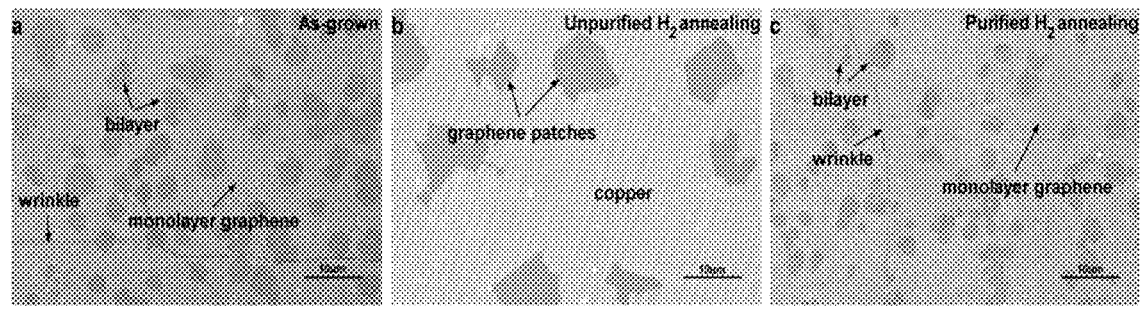
FIG. 4 shows SEM images of (a) as-grown graphene film on a copper foil, and annealed samples at 950° C. for 30 min in 500 mTorr of (b) unpurified ultra-high purity (UHP)-grade H$_2$, and c) purified UHP-grade H$_2$.

FIG. 4a shows a SEM image from an as-grown graphene layer. The film is continuous with small areas exhibiting the growth of a $2^{nd}$ graphene layer. These films are comparable to the best reported data [X. Li, W. Cai, J. An, S. Kim, J. Nah, D. Yang, R. Piner, A. Velamakanni, I. Jung, E. Tutuc, S. K. Banerjee, L. Colombo, and R. S. Ruoff, "Large-area synthesis of high-quality and uniform graphene films on copper foils," *Science*, vol. 324, pp. 1312-4, Jun. 5, 2009].

Figure 5:
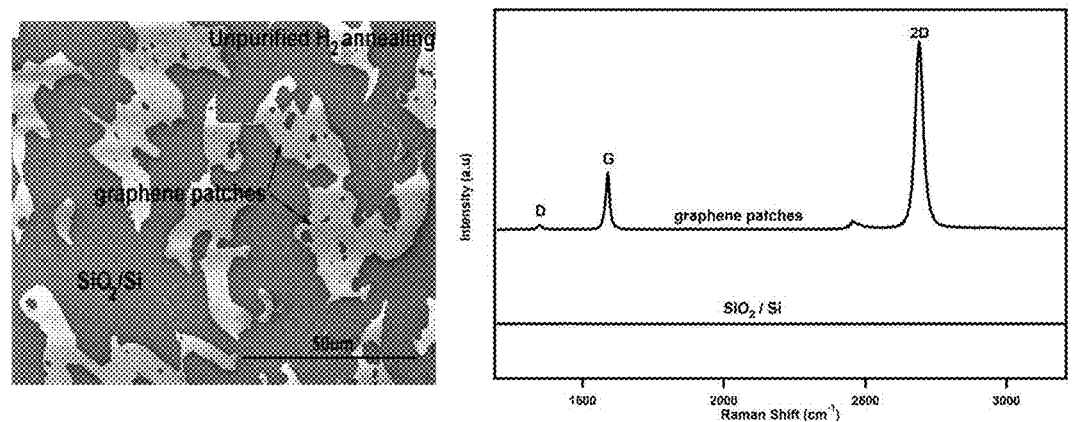
FIG. 5 shows a SEM image and Raman spectra of the unpurified hydrogen annealed sample as shown in FIG. 1b at 950° C. for 30 min transferred on SiO$_2$/Si.

Films annealed for 30 min at 950° C. in unpurified UHP $H_2$ are considerably etched, as depicted in the SEM micrograph of FIG. 4b. Only small patches of graphene remain visible on the surface. The samples were transferred on $SiO_2$/Si for further analysis and it is confirmed by Raman spectra and SEM contrast that the small patches are indeed graphene (see FIG. 5). FIG. 5 is the SEM image of the transferred graphene sample presented in FIG. 4b. It also shows the Raman spectra for this sample. Based on the SEM image contrast and Raman measurement, it is confirmed that the small patches are indeed the remaining graphene.

In stark contrast, FIG. 4(c) reveals that the same annealing procedure carried out in purified UHP $H_2$ has virtually no effect on the graphene films.

These observations confirm that molecular hydrogen does not etch graphene films on Cu at typical growth temperatures and partial pressures. These results also highlight that partial pressures of oxidizing impurities found in typical growth conditions are sufficient to activate a competing etching reaction pathway during graphene LP-CVD, even during the actual growth stage and sample cool-down.

3.2 Graphene Growth

Figure 6:
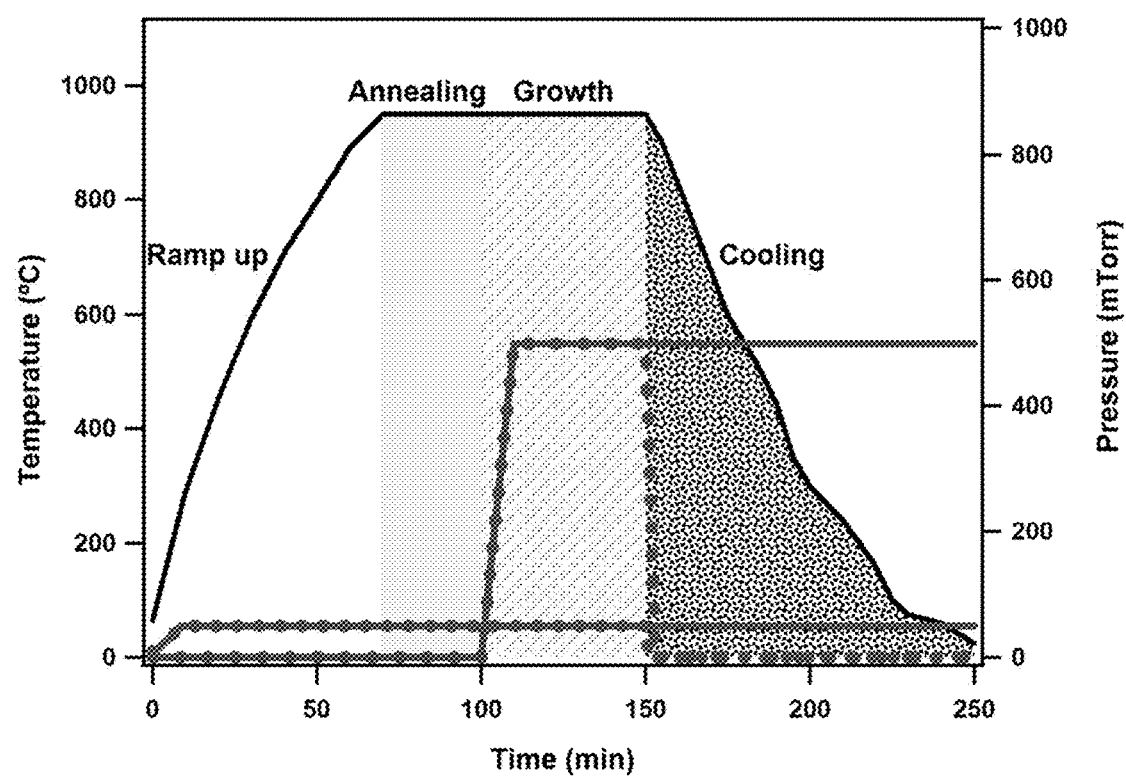
FIG. 6 is a schematic of the typical CVD growth process. Broad lines depict the temperature profile. The fine solid lines represent the partial pressure of the specific gas present during the annealing, growth, and cooling stages (i.e: H$_2$ purple and CH$_4$ green) while the dashed lines are used to emphasize the fact that, for some experiments, gas flows were interrupted during the cool down period.

We designed a series of experiments to clarify the role of $H_2$ and oxidizing impurities during graphene LP-CVD from $CH_4/H_2$ mixtures on copper foil. The typical graphene LP-CVD process is represented schematically in FIG. 6. Temperature profile as well as gas sequences are presented as a function of time for the entire growth process starting from a pre-deposition annealing stage to the graphene growth itself to the final cool-down phase.

FIG. 15 lists the complete set of experiments reported in this study. Each and every growth was conducted at least three times in the same conditions. Filled lines indicate the gas mixture used in each experiment.

TABLE 1

Detailed gas sequences for all samples investigated in this study

| Run | Flow | Cu treatment | Growth | Cooling | Resulting graphene film |
|---|---|---|---|---|---|
| 1. $CH_4$ | | | | | Etched |
| 2. $CH_{4, Purified}$ | | | | | Complete |
| 3. $CH_4 + H_2$ | | | | | Complete |
| 4. $CH_4 + H_2$ | | | | | Etched |
| 5. $CH_4 + H_2$ | | | | | Etched |
| 6. $CH_4 + H_2$ | | | | | Etched |
| 7. $CH_4 + H_{2, Purified}$ | | | | | Complete |
| 8. $CH_4 + H_{2, Purified}$ | | | | | Complete |
| 9. $CH_4 + Ar_{Purified}$ | | | | | Etched |

| | |
|---|---|
| $CH_4$ | |
| $CH_{4, Purified}$ | |
| $H_2$ | |
| $H_{2, Purified}$ | |
| $Ar_{Purified}$ | |

3.2.1 Growth from Unpurified and Purified Methane

In a first series of experiments, we wanted to verify if, as suggested by some authors, hydrogen is required for growing complete graphene layers.

Figure 7:
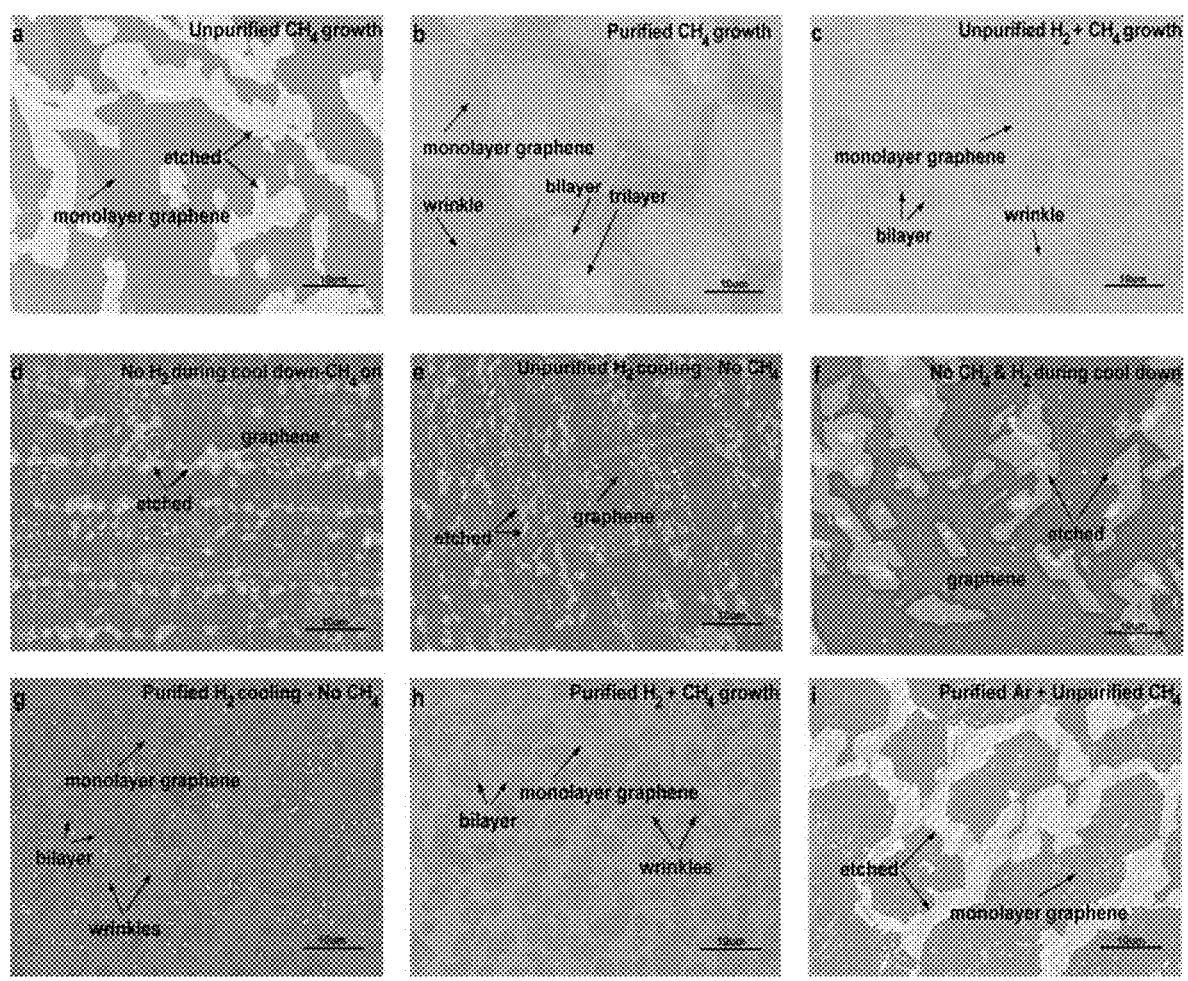
FIG. 7 shows SEM images of graphene films grown on copper foils at a temperature of 1000° C. and a total pressure of 500 mTorr.
  a) unpurified Methane (Table 1, Run #1),
  b) purified methane (Table 1, Run #2),
  c) unpurified methane and UHP hydrogen (based on the original CVD recipe) (Table 1, Run #3),
  d) unpurified methane and UHP hydrogen during growth but only unpurified methane during cool down (Table 1, Run #4),
  e) unpurified UHP hydrogen and methane during growth but only unpurified UHP hydrogen during cool down (Table 1, Run #5),
  f) unpurified UHP hydrogen and methane during growth but both stopped during cool down (Table 1, Run #6),
  g) purified UHP hydrogen and unpurified methane during growth but only purified hydrogen during cool down (Table 1, Run #7),
  h) purified UHP hydrogen and unpurified methane growth both on during cool down (Table 1, Run #8) and
  i) purified argon and unpurified methane (Table 1, Run #9)

The SEM image in FIG. 7a, corresponding to a film grown with only unpurified methane present during all stages of the process (including the cool-down period), reveals that the graphene layers are incomplete when grown under these conditions. In stark contrast, the micrograph in FIG. 7b corresponding to a film grown with only purified methane present during all stages of the process (including cool-down), clearly demonstrates that hydrogen is not required for obtaining complete graphene layers. These results indicate (i) that hydrogen is not required for graphene growth and (ii) that, in the absence of hydrogen, low level of oxidizing impurities are essential for achieving continuous and uniform graphene films.

3.2.2 Effects of Methane and Hydrogen During Post-growth Cooling

Since the experiments described above reveal that graphene can be grown from methane alone, we investigated the role played by hydrogen when added to the gas mixture. The experiments summarized in lines 3 to 8 of Table 1 were devised to enable us to decouple the effects during the growth and cool-down stage.

We first used unpurified hydrogen and methane, both being present during growth and cooling. These films are complete as shown in FIG. 7c (Table 1, Run #3). In comparison, non-continuous films are obtained for samples grown with unpurified methane and hydrogen whether only hydrogen (Table 1, Run #4) or methane (Table 1, Run #5) are present during cool down (FIGS. 7d and e, respectively). Layers are also etched when cool down is carried out under vacuum as shown in FIG. 7f (Table 1, Run #6). However, samples grown from unpurified methane and purified hydrogen but with only purified hydrogen during cool down (Table 1, Run #7) are continuous and uniform (FIG. 7g). Graphene layers are also continuous and uniform (FIG. 7h) when both purified hydrogen and unpurified methane are present during cool down (Table 1, Run #8).

We attribute this overall behavior to the presence of residual oxidizing impurities at levels sufficiently high to etch graphene at high temperature. The use of purified UHP hydrogen during cooling, when no methane is present, prevents graphene etching and leads to uniform and continuous films on the copper substrate. Moreover, the use of unpurified hydrogen and methane gases, taken separately, which contain a low level of oxidizing impurities (~1-15 ppm), readily leads to etching of graphene on copper at these high temperatures. Finally, we believe that the sample cooled under vacuum is etched as a result of small air leaks into the vacuum system, inherent to the O-ring type of sealing of LP-CVD setups.

3.2.3 Growth (Methane and Purified Argon)

Since some growth experiments reported in the literature were conducted in Ar/H$_2$ mixtures [14, 15], a third set of experiments is performed by replacing hydrogen with purified argon (Table 1, Line 9). This procedure aims to test the effects of inert gases, but also to exclude any steric effect (occupying surface sites on copper) brought by hydrogen gas on the surface in graphene LP-CVD. The SEM image in FIG. 7i reveals that samples grown from unpurified methane and purified Ar are etched and non-continuous.

3.3 Graphene Multilayer Growth in Purified Conditions

The results presented in section 3.2 and summarized in Table 1 demonstrate that continuous graphene films can be obtained in several ways. A careful analysis of SEM images nevertheless reveals that samples grown under purified conditions exhibit a higher density of graphene bilayer domains, a higher overall coverage of bilayers, and most importantly multilayers when solely purified methane is used for growth.

We compared the samples grown using unpurified methane and unpurified UHP hydrogen (Table 1, Run #3 & FIG. 7c) with samples grown using unpurified methane but purified UHP hydrogen (Table 1, Run #8 & FIG. 7h). The only difference between the two growth conditions is the hydrogen gas purity level. A detailed analysis of SEM images of three batches of each growth recipe showed that the surface coverage of bilayer domains increases by a factor of ~2 (from 25±6.2 to 54±6.3%), while the number of nucleation increases by a factor of ~2.5 when purified UHP hydrogen is used instead of unpurified hydrogen. Furthermore, graphene growth using purified methane (Table 1, Run #2 & FIG. 7b) reveals even greater differences. Comparing the results in FIG. 7c and FIG. 7b, we note a higher density of graphene bilayer domains, a higher overall bilayer coverage, and most importantly several areas of multilayers growth (bilayers, trilayers, etc.) when solely purified methane is used.

Figure 8:
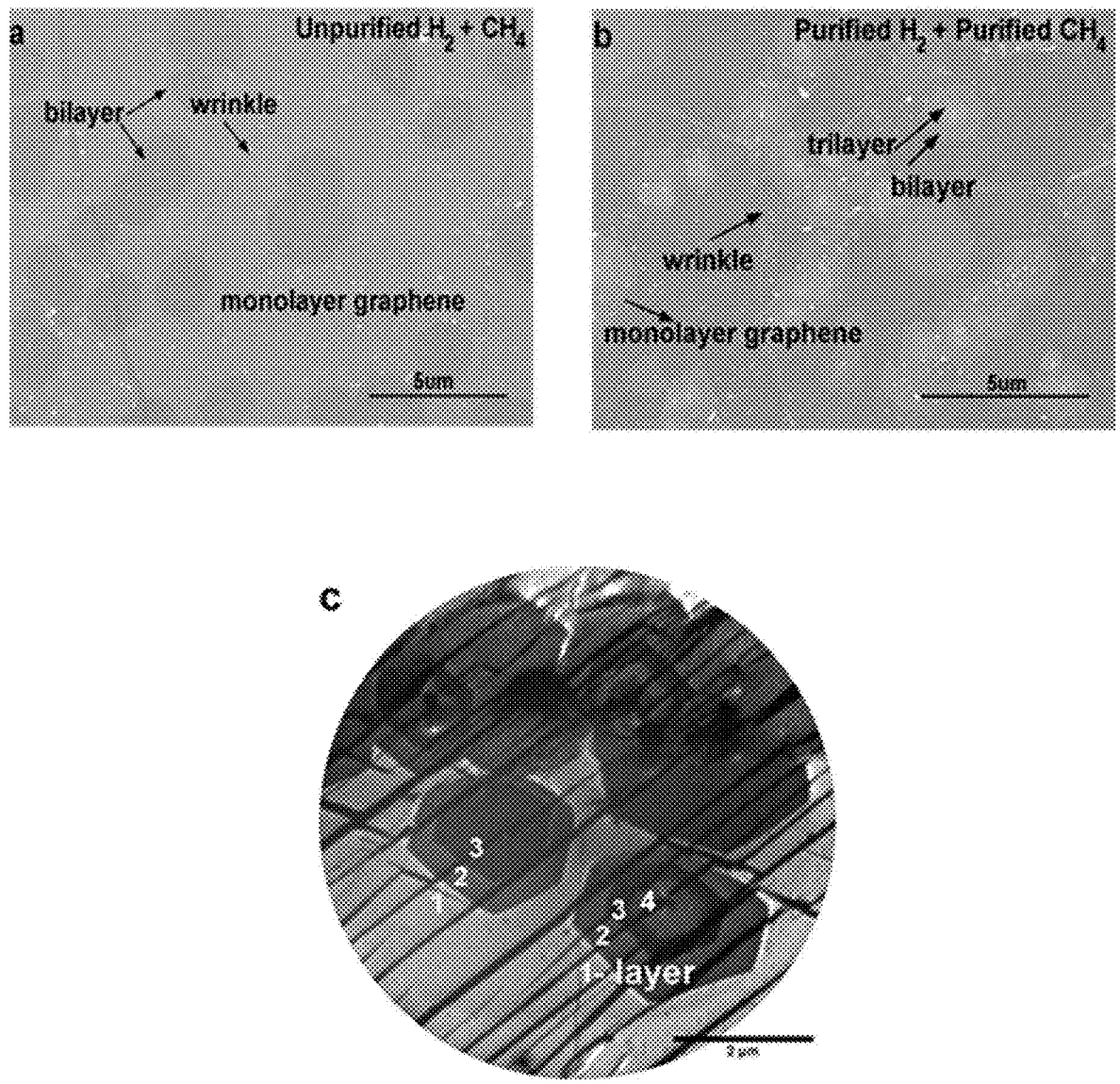
FIG. 8 shows SEM images of graphene films grown on copper foils based on original graphene growth recipe at 1000° C. and 500 mTorr using:
  a) unpurified UHP hydrogen and unpurified methane,
  b) purified UHP hydrogen and purified methane, and
  c) bright field (BF) LEEM image of graphene films grown on Cu foil in the same condition as b.

Graphene films grown on copper foils in a reducing environment, using purified methane and purified UHP hydrogen (FIG. 8b), in which the levels of oxidizing impurities are very low compared to the original graphene growth recipe (unpurified methane and unpurified UHP hydrogen, FIG. 8a), exhibit multilayer growth. This is similar to the case where purified methane is used solely during the growth and cool down phases (FIG. 7b). FIG. 8c is a LEEM image of a sample similar to that shown in the SEM image of FIG. 8b. The contrast in the LEEM image unambiguously differentiates multiple layers of graphene films grown on copper.

3.4 Raman Characterization

Figure 9:
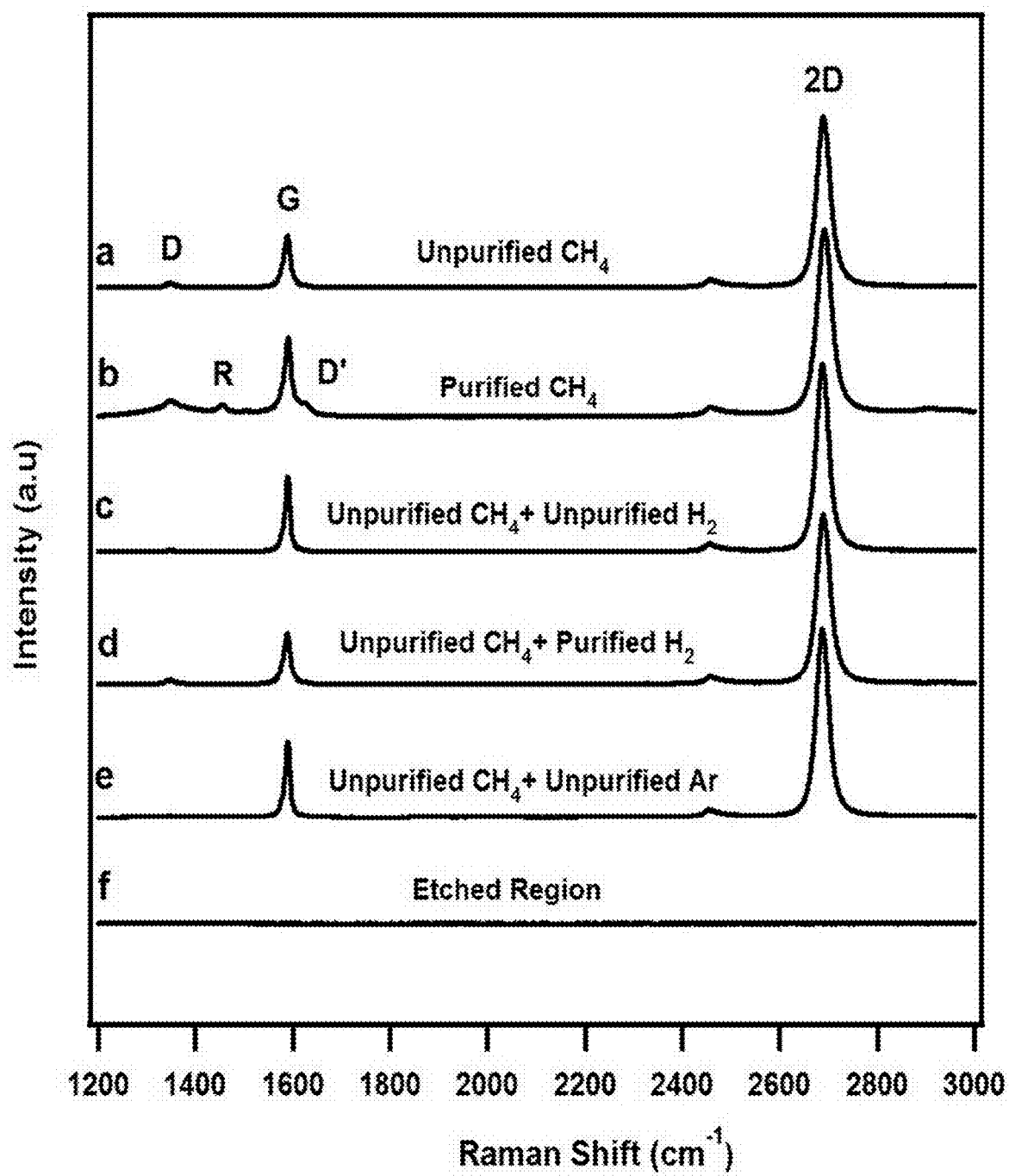
FIG. 9 shows the Raman spectra (Δ=514 nm) of graphene films grown on copper foils at a temperature of 1000° C. and a total pressure of 500 mTorr using the following gas mixtures:
  a) purified methane (Table 1, Run #1),
  b) unpurified methane (Table 1, Run #2),
  c) unpurified methane and unpurified UHP hydrogen-based on the original CVD recipe (Table 1, Run #3),
  d) unpurified methane and purified UHP hydrogen (Table 1, Run #8),
  e) unpurified methane and purified argon (Table 1, Run #9). curve f) presents for reference a Raman spectrum from an etched region of unpurified methane growth.

Raman spectroscopy is a nondestructive and powerful technique for evaluating the structural properties of graphene. It allows distinguishing graphene from graphite and determining the number of graphene layers and their structural quality. Raman microspectrometry measurements were carried out on all samples following the transfer of the graphene films onto a 100 nm SiO$_2$ layer on Si. Spectra from five representative graphene samples, together with a reference spectrum from an etched region, are presented in FIG. 9. Spectra from samples corresponding to Runs #4 to 6 were nearly identical to that from Run #3 (FIG. 9c) and are omitted for clarity. Similarly, the Raman spectrum of Run #7 was identical to Run #8 (c-d) and was also omitted for clarity.

Overall, the spectra reveal that the samples are high quality graphene layers as indicated by strong 2D and low D band intensities. The full width at half-maximum (FWHM) intensity of the 2D band is approximately 28 cm$^{-1}$ for all samples and the ratio of the 2D to G band peak intensity ($I_{2D}/I_G$) is ~3.2. These measurements confirm the presence of single layer graphene (SLG) and the low intensity of the D peak, associated with the presence of defects in graphene, indicates that the films maintain high quality after the transfer process.

The Raman spectrum from the film grown using purified methane (FIG. 9b) exhibits two additional peaks at approximately 1455 cm$^{-1}$ (the so-called R mode) and 1625 cm$^{-1}$ (the so-called D' mode). These modes have been ascribed to intravalley and intervalley interactions between two rotated graphene layers [33-35], thereby providing strong evidences that our grown samples contain twisted bilayer graphene (BLG) or/and multilayer graphene (MLG). In other words these Raman modes indicate that bi-, tri- and even thicker multilayer graphene films are formed with random rotational angles between them and that those MLG appear to grow without the directionality expected from the strong interlayer coupling. The presence of these multilayers is consistent with SEM and LEEM observations presented in FIGS. 7b and 8b-c.

We used hyperspectral Raman imaging to further investigate this behavior and to determine whether these Raman peaks (R and D' mode) are also present in graphene films grown in unpurified conditions. We focused on two extreme scenarios corresponding to highly oxidative and highly reductive growth conditions: i.e. growth using an unpurified hydrogen and methane mixture (Table 1, Run #3) and growth with solely purified methane (Table 1, Run #2).

Figure 10:
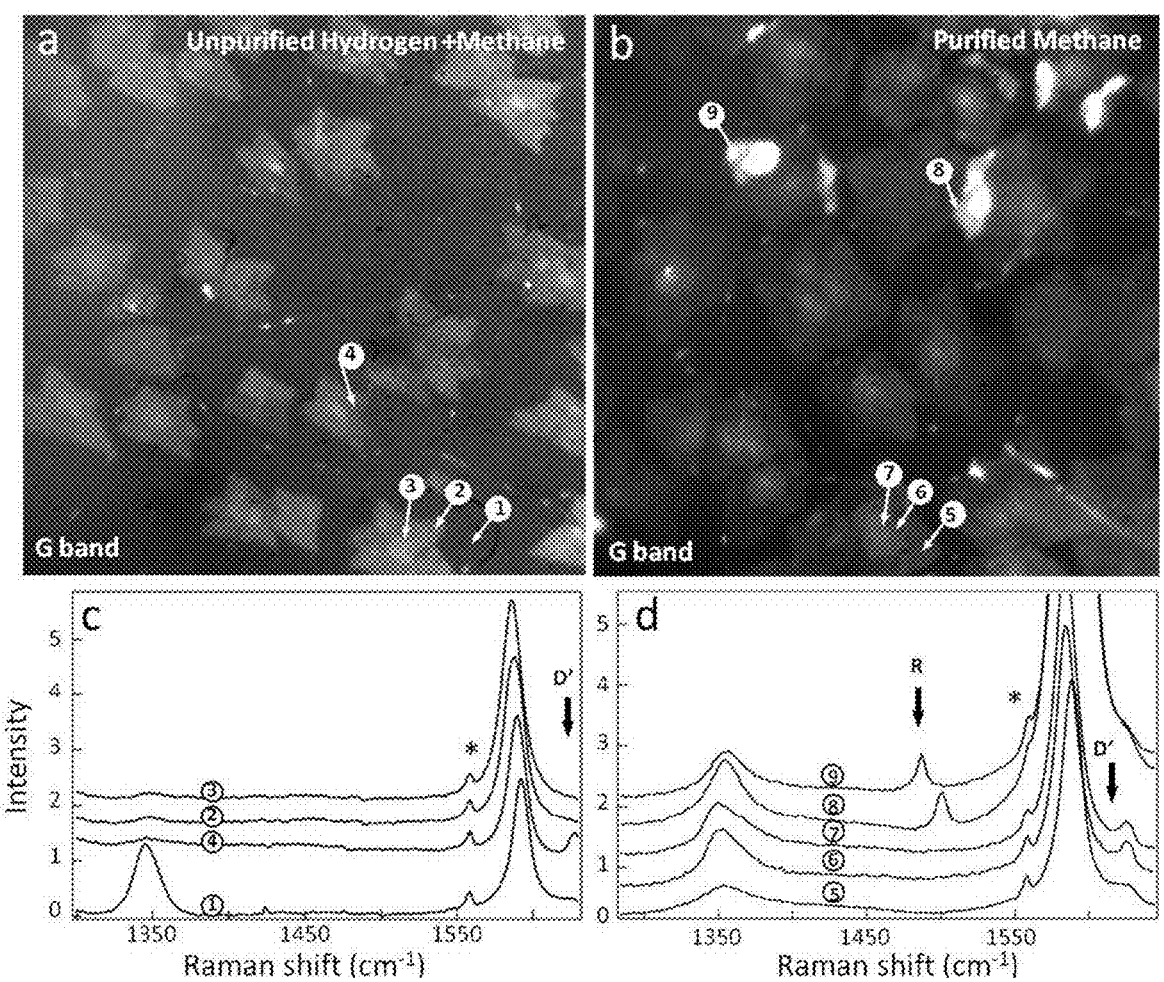
FIG. 10 (Example 1) shows Raman hyperspectral images of the G band intensity of layers grown on copper foils at a temperature of 1000° C. and a total pressure of 500 mTorr using:
  (a) the original graphene growth recipe (unpurified UHP hydrogen and methane) (Table 1, Run #3) and
  (b) purified methane only (Table 1, Run #1).
  (c-d), Raman spectra from specific areas' of the samples indicated in (a) and (b).

FIG. 10 (a-b) displays Raman images from both samples at the G-mode frequency extracted from the hyperspectral Raman data taken using an illumination wavelength of 532 nm. The intensity variations of the G-mode provide indications on the emergence and stacking of the bi- and tri-layers. These Raman images corroborate reasonably well with the SEM and LEEM (FIG. 7b-c and FIG. 8c) shown previously. Moreover, we notice a strong enhancement of the G band intensity in FIG. 10b (bright spots) in few BLG regions of the layers grown in purified methane conditions. This phenomenon on Raman intensity was described by Havener et al. as the emergence of a resonance due to a new singularity in twisted BLG joint density of state [R. W. Havener, H. L. Zhuang, L. Brown, R. G. Hennig, and J. Park, "Angle-Resolved Raman Imaging of Inter layer Rotations and Interactions in Twisted Bilayer Graphene," *Nano Letters*, vol. 12, pp. 3162-3167, June 2012.]. The energy position of this singularity is directly governed by the twist angle of the BLG. According to their work, the enhanced areas in FIG. 10b correspond to BLG with a twisted angle of about 13.5° for our laser wavelength ($\lambda$=532 nm).

Selected local spectra, extracted from the hyperspectral images at locations indicated in FIG. 10a-b, are presented in FIG. 10c-d, respectively. In addition to the common shape of the D band at 1350 cm$^{-1}$ and the G band at 1590 cm$^{-1}$, some of the spectra taken in the BLG regions—(bright spots 8-9 in FIG. 10b)—exhibit additional Raman features near 1550 cm$^{-1}$ (R mode) and 1640 cm$^{-1}$ (the D' mode). The presence of these modes provides further evidence that these BLG areas are twisted (i.e. rotated orientation relative to each other). Finally, note that the G band intensity enhancement and the emergence of the additional peaks in local Raman spectra indicate that twisted graphene layers are mostly present in purified conditions.

4. Discussion

The experimental results presented in the previous section clearly demonstrate that continuous and uniform graphene films can be grown in the sole presence of purified methane ($O_2$<1 ppbV). This indicates that methane serves the dual role of copper oxide reducer and carbon supplier for growth.

In addition, the need of having purified methane present in the chamber during cooling for obtaining complete graphene films suggests that small amounts of oxidative impurities can leak into typical low-pressure CVD systems fitted with O-ring seals. Adding a flow of purified methane during the cooling stage provides a reducing environment that is sufficient to protect the films against oxidation and to help maintain the overall conditions required for graphene stability and growth at high temperature.

The unpurified $CH_4/H_2$ mixture, as reported in the original graphene LP-CVD growth recipe, provides similar but enhanced reducing conditions that prevent etching from background impurities. Besides supplying carbon for growth, the chemistry most likely involves additional reductive reaction paths against the oxidizing species introduced into the chamber. Once growth is complete, however, it is only required to prevent etching from air leaks during cool-down; this could be achieved by flowing merely purified UHP hydrogen. Our results show that, when it comes to etching prevention, purified UHP hydrogen works as well as a mixture of unpurified $CH_4/H_2$, which precise composition appears to depend on the oxygen level introduced into the CVD chamber.

By replacing hydrogen with purified Argon, the results confirmed our hypothesis that Ar, an inert gas, plays no direct role in graphene low pressure CVD growth. Thus, in conditions where the level of oxidizing impurities is typical of UHP gases, purified UHP hydrogen appears to be the best option for establishing reductive conditions and preventing etching of growing or previously grown graphene films on copper.

The growth and annealing experiments described above strongly support that hydrogen does not etch graphene on Cu in LP-CVD, even at high temperatures. We therefore conclude that the role played by hydrogen is to protect the film against oxidative etching reactions.

While our results demonstrate that complete graphene layers can be obtained using a variety of growth conditions (see Table 1), they also reveal important differences in the resulting films. Namely, we observed that films grown from purified gases exhibited a significantly higher bilayer and multilayer coverage compared to films grown using the "standard" recipe involving as-received UHP precursors.

In the literature, there is a consensus that catalytic decomposition of methane by Cu generates mobile intermediate species, such as $C_mH_n$: (e.g. $CH_3$, $CH_2$, CH, C, $C_2H_n$, etc.) on the Cu surface, which are growth precursors for the multilayers. The mechanism of formation of these multilayers is however not well understood and is even controversial. Nie et al. [S. Nie, W. Wu, S. Xing, Q. Yu, J. Bao, S.-s. Pei, and K. F. McCarty, "Growth from below: bilayer graphene on copper by chemical vapor deposition," *New Journal of Physics*, vol. 14, p. 093028, 2012] reported an underlayer growth mechanism where the second layer and subsequent layers are grown from below. They believe that new layers nucleate and grow next to the substrate and the graphene multilayer growth terminates once the Cu is covered with the main layer. Other groups have concluded using Raman investigation of isotope-labeled bilayer films that these multilayers are indeed underneath the first or main graphene layer [W. Fang, A. L. Hsu, R. Caudillo, Y. Song, A. G. Birdwell, E. Zakar, M. Kalbac, M. Dubey, T. Palacios, M. S. Dresselhaus, P. T. Araujo, and J. Kong, "Rapid Identification of Stacking Orientation in Isotopically Labeled Chemical-Vapor Grown Bilayer Graphene by Raman Spectroscopy," *Nano Letters*, vol. 13, pp. 1541-1548, April 2013; Q. Y. Li, H. Chou, J. H. Zhong, J. Y. Liu, A. Dolocan, J. Y. Zhang, Y. H. Zhou, R. S. Ruoff, S. S. Chen, and W. W. Cai, "Growth of Adlayer Graphene on Cu Studied by Carbon Isotope Labeling," *Nano Letters*, vol. 13, pp. 486-490, February 2013.]. On the contrary, other studies proposed that the multilayers are rather grown on top of previously formed domains and this is mostly due to the excess supply of methane [A. W. Robertson and J. H. Warner, "Hexagonal single crystal domains of few-layer graphene on copper foils," *Nano Letters*, vol. 11, pp. 1182-9, Mar. 9, 2011; K. Yan, H. Peng, Y. Zhou, H. Li, and Z. Liu, "Formation of bilayer bernal graphene: layer-by-layer epitaxy via chemical vapor deposition," *Nano Letters*, vol. 11, pp. 1106-10, Mar. 9, 2011; and M. Kalbac, O. Frank, and L. Kavan, "The control of graphene double-layer formation in copper-catalyzed chemical vapor deposition," *Carbon*, vol. 50, pp. 3682-3687, 2012].

Our entire set of results reveals that multilayer growth occurs primarily in highly reducing environments, when the level of oxidizing impurities during LP-CVD is low. Moreover, our results indicate that Cu is an active interface not only for the growth but also for the etching and that etching is not occurring via hydrogen, but from oxygen impurities. Therefore, in the absence of oxidizing species, the films cannot be etched and the carbon precursors cannot be burnt at the Cu interface, leading to an excess amount of carbon species and further multilayer growth. The top growth mechanism appears therefore inconsistent with these conclusions because the Cu catalyst providing growth and etching of the graphene edges is blocked as the main graphene layer becomes larger than the multilayer islands. Note that etching by impurities is not observed on graphene layers on $SiO_2$ (i.e. no Cu). Thus, we believe that the most plausible growth mechanism is from below since multilayers can grow/etch as long as the bare Cu surface is available for dissociating $CH_4$ to grow graphene layers and adsorb impurities to etch graphene. When the main layer is complete, however, the growth/etching rates of these multilayers drop significantly, even after longer exposure time, due to a lack of new supply of carbon and impurities.

Furthermore, in the original graphene growth recipe—in which methane and UHP hydrogen are both unpurified—the surface coverage of bilayer domains is reduced by a factor of ~2 while the number of nuclei is decreased by a factor of ~2.5, compared to the case where purified UHP hydrogen and unpurified methane is used. We believe that in the presence of higher amounts of oxidizing impurities, graphene islands are etched and that growth precursor's species are captured; therefore the number and size of graphene islands decreases. Consequently, few bilayer and multilayer areas remain at the end of the growth process. This implies that controlling the level of oxygen during the growth is a powerful mean to tailor the morphology of the film.

Lastly, Raman imaging has shown that MLG films grown in the sole presence of purified methane contains twisted bilayers whereas no evidence of such incommensurability is observed on the films grown based on the original graphene growth recipe [X. Li, W. Cai, J. An, S. Kim, J. Nah, D. Yang, R. Piner, A. Velamakanni, I. Jung, E. Tutuc, S. K. Banerjee, L. Colombo, and R. S. Ruoff, "Large-area synthesis of high-quality and uniform graphene films on copper foils," *Science*, vol. 324, pp. 1312-4, Jun. 5, 2009.]. This is consistent with the above growth behavior where a highly reduced environment, in which etching is minimized, favors multilayer growth. Due to the absence of oxidizing impurities, the overall "effective" attachment rate of carbon species to the graphene edge, the mere nature of the methane intermediate species as well as their mobility are likely to be modified since nothing is blocking or interfering with them during the growth process. The presence of incommensurate graphene multilayers is therefore evidence that these changes lead to different growth kinetics. In the unpurified growth conditions, graphene nucleation and growth occur while the competition between carbon atoms impinging the surface and attaching to graphene edges and oxidizing impurities etching some of these C species remains active. These oxidative species thus slow down the kinetics and add more freedom to the carbon atoms to be placed in accordance with each other, which direct consequence is the formation of more commensurate BLG and MLG.

5. Conclusion

We have shown that hydrogen is not required for graphene growth from methane in the absence of oxidizing impurities. We also confirmed that purified UHP hydrogen does not etch graphene in low pressure CVD conditions and that small amounts of oxidizing species are responsible for this etching reaction. Using carefully designed graphene growth experiments, we have decoupled the role of hydrogen and oxidizing species during the growth and cooling stages. We revealed that oxidizing impurities clearly play a significant role in graphene CVD and that a flow of hydrogen can counterbalance the graphene etching reaction. Furthermore, films grown under high purity conditions (low level of oxidizing impurities) exhibit a higher bilayer and multilayer coverage, as observed with low energy electron microscope (LEEM) and scanning electron microscope (SEM). Surprisingly, these bi- and multi-layer graphene islands are twisted with respect to the first graphene layer as revealed by hyperspectral Raman imaging.

EXAMPLE 2

Speeding-up Graphene Chemical Vapor Deposition

Introduction

A careful analysis of the recent literature on LP-CVD of graphene on Cu reveals numerous apparent inconsistencies in terms of optimal growth parameters. In particular, growth duration for CVD from a methane/hydrogen mixture ranges from 5 to 45 min or even higher with no specific reasoning behind it. We recently suggested that oxygen impurities, not hydrogen, are responsible for graphene etching on copper and that there is a competitive action between oxidation and carbon growth during graphene formation in LP-CVD reactor. [S. Choubak, M. Biron, P. L. Levesque, R. Martel, and P. Desjardins, *J. Phys. Chem. Lett.* 2013, 4, 1100-1103] We show here that the presence of different levels of impurities in the furnace atmosphere and gas feedstock explains the discrepancies in growth recipes from one group to another. In the relative absence of these oxidizing impurities, we hypothesize here and then show that oxidation and etching is minimized and copper is covered by graphene film in virtually no time.

Here, we report on how to maximize the growth efficiency of high quality single layer graphene films using methane CVD. In fact, we report the accelerated formation of continuous, high quality single graphene film on copper foil from a methane/hydrogen mixture. This is accomplished by carrying growth in a controlled environment where the level of oxidative impurities is greatly reduced compared to standard LP-CVD growth conditions. [X. Li, W. Cai, J. An, S. Kim, J. Nah, D. Yang, R. Piner, A. Velamakanni, I. Jung, E. Tutuc, S. K. Banerjee, L. Colombo, and R. S. Ruoff, *Science*. 2009, 324, 1312-4.] In a series of experiments where growth time is decreased from 45 min down to 1 min, no clear difference in the quality and morphology of the film is observed. In contrast, control growth experiments carried out in standard conditions, where the level of oxidative species are typical of graphene LP-CVD, show that more than 20 min are required to achieve full graphene coverage and high quality films. Our results highlight a competitive action between adsorbed methane intermediate species as carbon precursors and surface oxygen as the growth inhibitor. Decreasing the amount of oxygen in the feedstock allows graphene fast growth. Impurity level of less than 5 ppm $O_2$ with respect to $H_2$ allows the continuous growth of graphene films on copper.

FIG. 11 summarizes the above findings. More details are provided below.

We develop a rate-equation kinetic model (discussed in details in Example 3 below) describing this graphene growth process, which includes a competitive reaction between the carbon species and the oxidizing impurities, while considering also the effect of hydrogen gas for inhibiting the oxidizing etching reaction and protecting the film. By including the effects of hydrogen and oxidizing impurities, our kinetic model is qualitatively in agreement with the general trends reported in literature on the growth of graphene films on copper and readily explains the faster growth rate reported here.

Experimental Section

Graphene films were grown on 25 µm thick Cu foils (Alfa Aesar, item no. 13382) at 1000° C. in a 1.5 inch fused quartz tube at low pressure. The system consists of a manifold capable of UHV conditions where the gases are introduced into the chamber. The system's base pressure prior to gas insertion is below $5\times10^{-6}$ Torr. Gas purifiers were installed on as-received gas bottles in order to decrease the residual $O_2$ content in UHP gases to less than 1 ppbV. We used DEOXO™ ($O_2$<1 ppb) for $H_2$ (Praxair, UHP, grade 5, $O_2$<1 ppm), and SAES Pure Gas Inc. MC1-950FV ($H_2O$ and $O_2$<1 ppbV) for $CH_4$ (Praxair, UHP, grade 3.7, $O_2$<15 ppm). The Cu foils were chemically cleaned in 1 M acetic acid (Sigma Aldrich, Reagent Plus>99%) at 60° C. followed by acetone and then 2-propanol (without drying) for 10 min in each step. The Cu substrates are then blown-dried with nitrogen. They were heated to 1000° C. and annealed at this temperature for 30 min under the flow of purified $H_2$ at 50 mTorr. In order to grow graphene, purified $CH_4$ was introduced into the chamber and the total pressure reached 500 mTorr. After the desired growth time (45, 30, 20, 10, 5, and 1 min), purified methane exposure was stopped and evacuated from the furnace. The methane evacuation from the system takes less than 1 min. The chamber was cooled down to room temperature under the flow of purified $H_2$ solely. The growth in standard conditions—where the level of oxidative species are relatively higher than in the purified conditions—were conducted using as-received $CH_4$ (Praxair, UHP, grade 3.7, $O_2$<15 ppm) as the carbon source.

Graphene samples were examined by scanning electron microscopy (SEM-JSM-7600F) operated at 1 kV and in some cases low energy electron microscopy (FE-LEEM P90 from SPECS-GmbH) performed at 4.4 eV kinetic energy in the UHV chamber (base pressure $4\times10^{-10}$ mbar). Their quality was assessed using Raman Spectroscopy (Renishaw Invia) with a laser wavelength of 514 nm. A 50× objective (N.A=0.55) focuses a 4 mW laser beam to a probe spot about 1 µm in diameter. The graphene films grown on copper were transferred onto $SiO_2$ (100-nm-thick)/Si wafers by a liquid phase method based on poly-methyl methacrylate (PMMA) support. [J. W. Suk, A. Kitt, C. W. Magnuson, Y. F. Hao, S. Ahmed, J. H. An, A. K. Swan, B. B. Goldberg, and R. S. Ruoff, ACS Nano.2011, 5, 6916-6924]

Results

FIG. 12 shows SEM images of graphene films grown on copper for different growth times and gas purity levels. FIG. 12(a-f) are images for growth in purified conditions starting from 45 min growth time down to 1 min. The lower growth time limit was dictated by limitations of our experimental setup, we were unable to measure growth occurring in a shorter time frame under the same pressure conditions. Continuous, hole-free, monolayer graphene films are formed on copper foil even down to 1 min. Interestingly, no significant difference was observed between all the films grown under purified conditions.

For validation and comparison purposes, we removed the methane purifier from the line and conducted growth studies using as-received UHP methane ($O_2$<15 ppm) and purified hydrogen ($O_2$<1 ppb). Except for the methane purifier being removed, all the growth conditions are exactly the same as the previous experiments discussed above. We chose three different growth times 5, 20, and 45 min to investigate the graphene film growth evolution and behavior until a complete layer is observed (FIG. 12(g-i)). The impact of the oxidizing impurity is evident; the growth for 5 and 20 min leads to an incomplete coverage of graphene film on copper whereas the film is complete after 45 min. These results further reveal the importance of a competitive action between growth and growth inhibition by oxidation during graphene synthesis in LP-CVD reactor. In the absence of oxidizing impurities, graphene films can be formed on copper foil in less than 1 min.

Micro-Raman spectroscopy measurements were carried out on graphene layers prepared using purified methane after transferring them on $SiO_2$ in order to determine the number of layers and film quality. Raman spectra from films grown for different times are presented in FIG. 13. They reveal that films grown from purified methane are high quality graphene layers, as indicated by strong 2D and low D band intensities. The full width at half-maximum (FWHM) intensity of the 2D band is approximately 28 $cm^{-1}$ for all samples and the ratio of the 2D to G band peak intensity ($I_{2D}/I_G$) is ~3.2. These measurements confirm the presence of single layer graphene (SLG) and the low intensity of the D peak, associated with the presence of defects in graphene, indicates that the films is of high quality.

FIG. 13b is a LEEM image of a 1 min graphene sample grown on copper from purified methane. The graphene film covers the whole surface and, as the film is uniform, the contrast arises from copper structures. The bright areas and dark lines are graphene covered copper terraces and facets, respectively. LEED pattern in FIG. 13c shows sharp single layer graphene diffraction spots indicating the good crystallinity of the graphene sheet. The diffraction spots marked by red arrows are from a single layer graphene domain lying on the copper terraces while the diffraction spots circled in blue are from the same graphene domain lying on the copper facets. The angle between the facet and the principal Cu(001) plane is 16.5±1 deg. which corresponds to the Cu (632) surface reported previously on copper foil.[J. D. Wood, S. W. Schmucker, A. S. Lyons, E. Pop, and J. W. Lyding, Nano Lett. 2011, 11, 4547-4554.] LEED patterns have been acquired at various locations on the sample surface and several orientations, random in appearance, have been found. The sample can be moved slightly to shifted locations exhibiting only one LEED pattern within the illuminated area of 10 µm, which implies that the graphene film is polycrystalline and the grain sizes are larger than 10 µm.

Our entire set of results could be assembled into a simple rate-equation kinetic model of graphene CVD on Cu in the presence of oxygen impurities and solved using quasi-steady state approximation. Based on data in literature, [H. Mehdipour and K. Ostrikov, ACS Nano. 2012, 6, 10276-10286; H. Kim, C. Mattevi, M. R. Calvo, J. C. Oberg, L. Artiglia, S. Agnoli, C. F. Hirjibehedin, M. Chhowalla, and E. Saiz, ACS Nano. 2012, 6, 3614-3623; W. Zhang, P. Wu, Z. Li, and J. Yang, J. Phys. Chem. C. 2011, 115, 17782-17787; and K.

HoKwon, S. Eduardo, C. Manish, and M. Cecilia, New J. Phys. 2013, 15, 053012.] we assumed that methane adsorbs and dissociates on copper by forming Growth Intermediate Species (GIS) that can then be converted to graphene or alternatively react with adsorbed oxidizing impurities and desorb. The model considers also an inhibition channel to GIS oxidation-desorption through a reaction with gaseous hydrogen molecules. We assumed that only the free Cu surface sites (no graphene) are reactive and exposed to constant gas pressure. As detailed in the supplementary information (SI), the model yields the following overall graphene growth rate equation:

$$\frac{d\theta_{Graphene}}{dt} =$$

$$k_{diss(CH_4^*)} K_{ads(CH_4)} \frac{P_{CH_4}}{1 + k_{inhib}\frac{P_{O_2}}{P_{H_2}}\theta_*^2} \theta_*^{(n+1)}(1 - \theta_{Graphene}) f(\theta_{Graphene}),$$

$$w\frac{d\theta_{Graphene}}{dt} = k_{diss(CH_4^*)} K_{ads(CH_4)} \frac{P_{CH_4}}{1 + k_{inhib}\frac{P_{O_2}}{P_{H_2}}\theta_*^2} \theta_*^{(n+1)}(1 - \theta_{Graphene})$$

$$f\left(\theta_{Graphene} \frac{d\theta_{Graphene}}{dt} = k_{diss(CH_4^*)} K_{ads(CH_4)}\right.$$

$$\frac{P_{CH_4}}{1 + k_{inhib}\frac{P_{O_2}}{P_{H_2}}\theta_*^2} \theta_*^{(n+1)}(1 - \theta_{Graphene}) f(\theta_{Graphene} \text{ herein:}$$

$P_x$ is the partial pressure of the gas X in the furnace,
$\theta_{Graphene}$ is the coverage of graphene,
$\theta^*$ is the fraction of free sites on the surface,
n is the order of reaction for $CH_4$ dissociation, and
$CH_4^*$ is Methane adsorbed onto the Cu surface.
$k_{diss(CH_4^*)}$ and $K_{ads(CH_4)}$ are the dissociation reactions and the adsorption equilibrium constants of $CH_4$, respectively. As presented in Example 3 below, $k_{inhib}$ regroups several kinetic constants of the system and $f(\theta_{Graphene})$ is an evolving factor that accounts for geometric and diffusion considerations, such as nucleation, that are not explicitly included in our model. For example, $f(\theta_{Graphene})$ is expected to increase with $\theta_{Graphene}$ for a given number of nuclei because the perimeter of the islands increases. This effect provides more attaching sites and also shortens the average diffusion length with decreasing active area of bare Cu. As indicated in the SI, Cu sites remain nearly unoccupied during growth ($\theta^* \cong 1$) at all times and these Cu sites vacancies are therefore assumed to vary only slightly with changing pressure conditions.

Our model which is based on competitive reactions with hydrogen and oxidizing impurities correctly predicts most, if not all, experimental trends reported in the literature on graphene growth on copper. More specifically: the growth rate increases with both $P_{CH_4}$ and $P_{H_2}$ and decreases with $P_{O_2}$ and $\theta_{Graphene}$. Interestingly our model reveals that the $P_{CH_4}/P_{H_2}$ is not a fundamental parameter as often reported. See for example Zhang, Y. et al. Vapor Trapping Growth of Single-Crystalline Graphene Flowers: Synthesis, Morphology, and Electronic Properties. Nano Lett. 12, 2810-2816, (2012).

Discussion

Our experimental results demonstrate that oxidizing impurities are currently limiting graphene growth kinetics in a typical LP-CVD environment. By simply minimizing the oxygen level in the gas feedstock, continuous and uniform monolayer graphene film can be reliably grown on copper from methane within 1 min, which is between 5 to 45 times faster than what is reported up to this date. [S. Bae, H. Kim, Y. Lee, X. F. Xu, J. S. Park, Y. Zheng, J. Balakrishnan, T. Lei, H. R. Kim, Y. I. Song, Y. J. Kim, K. S. Kim, B. Ozyilmaz, J. H. Ahn, B. H. Hong, and S. Iijima, Nat. Nanotechnol. 2010, 5, 574-578; X. Li, W. Cai, J. An, S. Kim, J. Nah, D. Yang, R. Piner, A. Velamakanni, I. Jung, E. Tutuc, S. K. Banerjee, L. Colombo, and R. S. Ruoff, Science. 2009, 324, 1312-4; Y. Zhang, L. Zhang, and C. Zhou, Acc. Chem. Res. 2013, 46, 2329-39; L. Tao, J. Lee, H. Chou, M. Holt, R. S. Ruoff, and D. Akinwande, ACS Nano, 2012, 6, 2319-2325; S. S. Chen, H. X. Ji, H. Chou, Q. Y. Li, H. Y. Li, J. W. Suk, R. Piner, L. Liao, W. W. Cai, and R. S. Ruoff, Adv. Mater. 2013, 25, 2062-2065; Z. Han, A. Kimouche, D. Kalita, A. Allain, H. Arjmandi-Tash, A. Reserbat-Plantey, L. Marty, S. Pairis, V. Reita, N. Bendiab, J. Coraux, and V. Bouchiat, Adv. Funct. Mater. 2014, 24, 964-970, Z. Yan, J. Lin, Z. Peng, Z. Sun, Y. Zhu, L. Li, C. Xiang, E. L. Samuel, C. Kittrell, and J. M. Tour, ACS Nano. 2012, 6, 9110-9117, X. Li, C. W. Magnuson, A. Venugopal, J. An, J. W. Suk, B. Han, M. Borysiak, W. Cai, A. Velamakanni, Y. Zhu, L. Fu, E. M. Vogel, E. Voelkl, L. Colombo, and R. S. Ruoff, Nano Lett. 2010, 10, 4328-34, S. Bhaviripudi, X. T. Jia, M. S. Dresselhaus, and J. Kong, Nano Lett. 2010, 10, 4128-4133, P. R. Kidambi, C. Ducati, B. Dlubak, D. Gardiner, R. S. Weatherup, M.-B. Martin, P. Seneor, H. Coles, and S. Hofmann, J. Phys. Chem. C. 2012, 116, 22492-22501, H. Mehdipour and K. Ostrikov, ACS Nano. 2012, 6, 10276-10286, H. Kim, C. Mattevi, M. R. Calvo, J. C. Oberg, L. Artiglia, S. Agnoli, C. F. Hirjibehedin, M. Chhowalla, and E. Saiz, ACS Nano. 2012, 6, 3614-3623, R. M. Jacobberger and M. S. Arnold, Chem. Mater. 2013, 25, 871-877] The quality and uniformity of the graphene films are maintained even for the shortest growth times reported here, as demonstrated by SEM and Raman spectroscopy.

The fact that the SEM images in FIG. 12 do not show evidences of bi- and multi-layer formation, demonstrates that once a complete graphene layer is formed on copper, the layer is sealed and graphene formation terminates. Since Cu plays a catalytic role in decomposing methane, this observation is in line with previous growth studies in which graphene growth stops when no bare Cu remains. [S. Nie, W. Wu, S. Xing, Q. Yu, J. Bao, S.-s. Pei, and K. F. McCarty, New J. Phys. 2012, 14, 093028] Furthermore, we believe that minimum graphene growth time for complete layer can be further decreased below 1 min, but this could not be explored due to limitations of our CVD system.

Based on the growth model presented above, the graphene growth rate is controlled by the partial pressure of $CH_4$ and the ratio $$\frac{P_{O_2}}{P_{H_2}}.$$

For a given level of oxidizing impurities, increasing $P_{H_2}$ helps to maximize the growth rate—the growth rate reaches 50% of its maximum value, $r_{MAX}$, when $$\frac{P_{O_2}}{P_{H_2}} = \frac{1}{k_{inhinb}}$$

and then saturates, even after further increase of $P_{H_2}$. Based on our observed relative growth rates in purified and standard conditions and estimated levels of oxidizing impurities, a lower limit for $k_{inhib}$ is found to be 200 000 (see Example 3). This value sets the total level of oxidizing impurities with respect to $H_2$ to below $5\times10^{-6}$ in order to reach 50% of $r_{MAX}$ since $$\frac{P_{O_2}}{P_{H_2}} = \frac{1}{k_{inhinb}}$$

in me rate equation yields the criterion $$\frac{r_{MAX}}{2}.$$

This criterion can be seen as a transition point where the growth is limited by oxidizing impurities to a faster regime limited by $CH_4$ adsorption-dissociation. More importantly, lowering the impurity level by two orders of magnitude $$\left(\text{i.e. down to } \frac{P_{O_2}}{P_{H_2}} = 5\times10^{-8}\right)$$

would be required to reach 99% of $r_{MAX}$.

In standard LP-CVD systems, only three sources of oxidizing impurities can be identified: i) $H_2$ gas bottle, ii) $CH_4$ gas bottle and iii) air leaks into the CVD chamber from flanges and fittings. The base pressure ($5\times10^{-6}$ Torr) in our CVD system is expectedly limited by water desorption as verified with a portable RGA attached to our CVD through a UHV leak valve. $O_2$ is measured to be at least 30 to 100 times below this limit upon pumping and heating history. With the highest $O_2$ partial pressure measured (roughly $2\times10^{-7}$ Torr) at least 40 mTorr of pure $H_2$ would be required to compensate oxygen leaks and provide minimum conditions to reach $$\frac{r_{MAX}}{2}.$$

In growth conditions, for a sufficient flow rate compared to system leak rate, the furnace atmosphere purity is limited by the gas feedstock purity. In our system, the air leak rate is evaluated to $<1\times10^{-7}$ sccm by measuring the increase in pressure with time in the CVD chamber once water desorption reach equilibrium. This level of leak rate is the typical stated leak rate for Kwik-Flange type fittings. In growth conditions typically 50 sccm $H_2$ is used and a contribution of $$\frac{P_{O_2}}{P_{H_2}} = 4\times10^{-10}$$

can be attributed to the furnace leaks. With this ratio the growth speed is limited to 99.99% of $r_{MAX}$. The growth is then limited by the gas purity and not the furnace leaks. Our UHP grade of $H_2$ has however less than 1 ppm of $O_2$ and $CH_4$ feedstock contains less than 15 ppm of $O_2$, leading to $$\frac{P_{O_2}}{P_{H_2}} \cong 1\times10^{-4} \text{ using } P_{H_2} = 0.05 \text{ Torr and } P_{CH_4} = 0.5 \text{ Torr}$$

Without further purification of the gas, only 3% of $r_{MAX}$ can be reached in those conditions. To reach the criterion $$\frac{r_{MAX}}{2},$$

the hydrogen partial pressure has to be further increased to at least 1.5 Torr of pure $H_2$. From this simplified model, it appears clear that one can always compensate for the presence of $O_2$ impurities using a proportional level of pure $H_2$, but increasing further the pressure will eventually hinder the availability of reactive Cu sites and hence slow down the growth.

Oxidizing impurities have a dramatic effect on the growth rate. Slight changes in impurity level due to modification of the CVD chamber or sources of feedstock can therefore greatly impact growth consistency and reproducibility. Control over the level of oxygen in the growth atmosphere allows improving both growth speed and reproducibility, which was clearly lacking in the prior literature on graphene growth by LP-CVD.

The growth model presented above considers for the first time the competitive action between growth species (methane), growth inhibitor (oxygen), and oxidation inhibitor (hydrogen) for balancing conditions entailing the final graphene surface coverage on copper. According to the model, the graphene growth rate is essentially proportional to the methane partial pressure when the level of oxygen species tends towards zero. On the other hand, oxygen traces in methane slow down the growth reaction by allowing GIS species to desorb as CO molecules and eventually by etching graphene. Adding a flow of $H_2$ can counteract this last associative desorption reaction by reacting with oxygen species to form volatile $H_2O$. When removing oxygen impurities is difficult, additional $H_2$ can therefore be used to promote the growth process towards complete graphene layers, but this is at the expanse of a reduced growth speed compared to pure methane. Herein, oxidizing impurities are revealed as a dominant factor controlling growth speed and the developed model is in agreement with our findings.

Conclusion

Our experimental results show that the growth rate is severely impaired by the presence of oxidizing impurities. We have shown that in the absence of oxidizing impurities continuous and uniform monolayer graphene can be formed on copper using purified methane within 1 min of methane exposure. Our findings highlight the necessity to control the balance between carbon supply and oxygen to hydrogen pressure ratio in order to achieve reliable graphene growth on copper substrates. In fact, the model sets the limit between impurities limited growth and methane adsorption-dissociation limited growth. Growth in the standard ultra-high purity gas is in the impurities limited growth regime therefore, the role of oxidizing impurities cannot be ignored and some past interpretations in the prior art must be revisited at the light of this new finding. Based on our model in which surface reactions of $CH_4$, $O_2$ and $H_2$ on Cu are depicted, the lowest impurity level of $O_2$ with respect to $H_2$ should be at least below $5\times10^{-6}$ to reach 50% of the maximum possible growth rate. Once the $O_2$ and $H_2$ pressure ratio is optimized, the growth rate is limited by the $CH_4$ dissociation rate constant ($k_{CH_4}$) and its adsorption equilibrium constant ($K_{CH_4}$). Finally, the growth method shown in this report is straightforward and very simple to implement in industrial manufacturing processes making graphene sheets mass production economically feasible.

EXAMPLE 3

Details on the Kinetic Model Presented in Example 2

1) Surface Carbon Production Rate

The following model has been developed to simulate the effect of oxidizing impurities in the copper catalyzed graphene growth under reducing conditions. The model describes competitive reactions between the surface carbon species formed by the methane activation, inhibitor oxygen adsorbates, and anti-inhibitor hydrogen molecules. The simulation aims to determine the interplay between three main reaction channels:

1) GROWTH: methane dissociation at the copper surface to form Graphene Intermediate Species (GIS) and their reaction to grow graphene;
2) INHIBITION: adsorption and surface reaction of oxidizing impurities with GIS at the copper surface and desorption/elimination via CO gas; and
3) ANTI-INHIBITION: competitive hydrogenation of the oxidizing impurities at the surface of copper and desorption of water gas.

All the reactions are assumed to occur at the Cu surface. That is, no absorption, diffusion or reaction is allowed to take place on already formed graphene layer/patches. Note that this important assumption is supported by SEM observations of monolayer and continuous graphene films.

Under these assumptions the reaction scheme—on the uncovered copper surface—can be described as follows:

$$CH_{4(g)} + * \leftrightarrow CH_4^*; \quad (S1)$$

$$O_{2(g)} + * \leftrightarrow O_2^*; \quad (S2)$$

$$O_2^* + * \to 2O^*; \quad (S3)$$

$$CH_4^* + n^* \to CH_4^* + \left[(nH)^* \to \frac{n}{2}H_{2(g)} + n^*\right]; \quad (S4)$$

$$CH_y^* \to C_{graphene} + \left[yH^* \to \frac{y}{2}H_{2(g)} + y*\right]; \quad (S5)$$

$$CH_y^* + O^* \to CO_{(g)} + 2* + \left[yH^* \to \frac{y}{2}H_{2(g)} + y*\right]; \quad (S6)$$

$$O^* + H_{2(g)} \to H_2O_{(g)} + *; \quad (S7)$$

where $CH_4$ is the precursor gas, $H_2$ is the reducing agent, and $O_2$ represents oxidizing impurities. The supply of oxidizing impurities is either from impurities in $CH_4$ and $H_2$ feedstock, air leaks in the gas line, or both. The concentrations of the gas species are constant during the growth. * are unoccupied sites at the copper surface. All sites are considered equivalent.

The adsorption processes of $CH_4$ and $O_2$ on the copper surface are fast compared to graphene formation, thus pre-equilibrium approximation can be used in reactions (Equation 1S) and (Equation 2S). The rate equations:

$$r_1 = -k_1 P_{CH_4}\theta^* + k_1'\theta_{CH_4} \approx 0,$$

and $$r_2 = -k_2 P_{O_2}\theta^* + k_2'\theta_{O_2} \approx 0,$$

lead with pre-equilibrium approximation to:

$$\theta_{CH_4} \approx K_1 P_{CH_4}\theta^*; \quad (S8)$$

and $$\theta_{O_2} \approx K_2 P_{O_2}\theta^*. \quad (S9)$$

Here $r_i$ is the rate of the reaction, $P_x$ is the partial pressure of species X, $\theta^*$ is the fraction of free sites on the surface, $\theta_X$ is the fraction of sites on the surface occupied by X and finally $k_i$, $k_i'$ and $K_i$ are the reactions, counter reactions, and equilibrium constants of reaction (i), respectively.

Based on surface science studies, molecular hydrogen neither dissociates nor adsorbs on clean Cu surfaces, thus the adsorption of $H_2$ is neglected [M. Balooch, M. J. Cardillo, D. R. Miller, R. E. Stickney, Surf. Sci. 1974, 46, 358-392; R. J. Madix, J. Benziger, Annu. Rev. Phys. Chem. 1978, 29, 285-306.]. Reactions (S3) and (S4) are the dissociation reactions of $O_2$ and $CH_4$ on the copper surface, respectively. The decomposition of oxygen adsorbates into atomic oxygen (Equation S3) is assumed to be irreversible since copper oxide is quite stable in the range of reaction temperatures considered here [M. T. Clavaguera-Mora, J. L. Touron, J. Rodriguez-Viejo, N. Clavaguera, J. Alloys and Compounds. 2004, 377, 8-16]. The decomposition of $CH_4^*$ in reaction (S4) is also taken as irreversible since atomic hydrogen has a very short lifetime on copper surface [M. Balooch, M. J. Cardillo, D. R. Miller, R. E. Stickney, Surf. Sci. 1974, 46, 358-392; R. J. Madix, J. Benziger, Annu. Rev. Phys. Chem. 1978, 29, 285-306.].

The exact nature of the active carbon species (GIS)—produced by the decomposition of methane-adsorbed on the Cu surface leading to the formation of graphene is unknown. Consequently, the order of reaction remains unclear even if a complete successive dehydrogenation reactions of methane down to atomic carbon is considered. The reason is that copper surface sites will be quickly available due to rapid hydrogen desorption, which lowers the order of reaction. Therefore, as the exact decomposition state of the GIS is unknown, the $CH_4^*$ decomposition reaction is kept generic and the reaction is considered as an elementary reaction that simply needs a number n of free sites. Note that since $H_{surface} + H_{surface} \to H_2(gas)$ is extremely rapid, it is not further considered in the reaction scheme. However, it is considered in the overall reaction since the level of $H_2$ cannot be zero and will always be a fraction of $CH_4$.

The GIS appear in competitive reactions: either to form graphene (Equation S5) or be oxidized/burnt by oxidizing impurities (Equation S6). Both reactions are presumed irreversible since the process temperature for Equation S5 is far below the sublimation temperature of graphite of 4000° K [F. P. Bundy, Physica A, 1989,156, 169]; thus graphene formation is stable and irreversible. Reaction (S6) is a combustion reaction and therefore carbon species can only be further oxidized.

The main effect of hydrogen addition is to provide a new reaction pathway (Equation S7) competing with the oxidizing reaction (S6). This reaction frees GIS from oxidation for subsequent graphene growth (Equation S5). As mentioned above, molecular hydrogen neither adsorbs nor dissociates on the Cu surface. We propose that hydrogen gaseous molecules react directly with atomic oxygen adsorbates to form water (Equation S7). This reaction is also considered irreversible: water molecules will rapidly desorb into the gas phase at such a high temperature regime.

The growth rate of graphene is directly proportional to the production of GIS ($CH_y$) as shown in reaction (S5). Thus, this system will be first solved to gives GIS coverage.

While no adsorption, diffusion or reaction are assumed to occur on the already formed graphene islands, surface species (GIS or $CH_y$ and $O^*$) are considered in quasi-steady state. Therefore, we can deduce:

$$\frac{d\theta_{CH_y}}{dt} = k_4 \theta_{CH_4} \theta_*^n - k_5 \theta_{CH_y} - k_6 \theta_{CH_y} \theta_O \approx 0,$$

which gives:

$$\theta_{CH_y} = \frac{k_4 K_1 P_{CH_4}}{k_5 + k_6 \theta_O} \theta_*^{(n+1)}. \tag{S10}$$

and $$\frac{d\theta_O}{dt} = 2k_3 \theta_{O_2} \theta_* - k_6 \theta_{CH_y} \theta_O - k_7 \theta_O P_{H_2} \approx 0,$$

which gives:

$$\theta_O = \frac{2k_3 K_2 P_{O_2}}{k_6 \theta_{CH_y} + k_7 P_{H_2}} \theta_*^2. \tag{S11}$$

Equation S11 shows that hydrogen is required in order to grow graphene in the presence of oxidizing impurities. For sufficient large $H_2$ pressures, reaction (S7) overcomes reaction (S6). In these conditions, $k_6 \theta_{CH_y}$ is much smaller than $k_7 P_{H_2}$ and Equation 11S can be approximated using:

$$\theta_O \approx \frac{2k_3 K_2 P_{O_2}}{k_7 P_{H_2}} \theta_*^2. \tag{S12}$$

Substituting expression (12S) into (10S) gives:

$$\theta_{CH_y} \approx \frac{k_4 K_1 P_{CH_4}}{k_5 + \frac{2k_3 k_6 K_2 P_{O_2}}{k_7 P_{H_2}} \theta_*^2} \theta_*^{(n+1)}. \tag{S13}$$

2) Graphene Growth Rate

According to reaction (5S), the graphene growth rate $$\left(\frac{d\theta_{Graphene}}{dt}\right)$$

should be simply given by $$\frac{d\theta_{Graphene}}{dt} = k_5 \theta_{CH_y}.$$

With the assumption made that no adsorption, diffusion or reaction take place on the already formed graphene islands, the steady state approximation used to solve the kinetic equations is only valid on the graphene free substrate surface. In other words, the steady state approximation is only valid if we consider the uncovered graphene area. Therefore the active area is constantly reduced with the growing graphene coverage and $O_{CH_y}$ is renormalized by $1-\theta_{Graphene}$ to account for the whole surface of copper.

Considering the above statement and taking reaction (S5) into account:

$$\frac{d\theta_{Graphene}}{dt} = k_5 \theta_{CH_y} (1 - \theta_{Graphene}) f(\theta_{Graphene}). \tag{S14}$$

Here $f(\theta_{Graphene})$ is an evolving factor that accounts for geometric and diffusion considerations related for instance to nucleation process, which is not explicitly included here. Substituting $\theta_{CH_y}$ in (S14) by (S13) a simple expression for the graphene growth rate in reducing environment in the presence of oxidizing impurities is obtained:

$$\frac{d\theta_{Graphene}}{dt} = \tag{S15a}$$

$$k_4 K_1 + \frac{P_{CH_4}}{1 + \frac{2k_3 k_6 K_2 P_{O_2}}{k_5 k_7 P_{H_2}} \theta_*^2} \theta_*^{(n+1)} (1 - \theta_{Graphene}) f(\theta_{Graphene}).$$

Renaming and rearranging the constants:

$$\frac{d\theta_{Graphene}}{dt} = \tag{S15b}$$

$$k_{diss(CH_4^*)} K_{ads(CH_4)} \frac{P_{CH_4}}{1 + k_{inhib} \frac{P_{O_2}}{P_{H_2}} \theta_*^2} \theta_*^{(n+1)} (1 - \theta_{Graphene}) f(\theta_{Graphene})$$

3) Coverage Dependencies with Gas Pressures

Expression (S15b) indicates that graphene growth rate is influenced to a large extent by the coverage dependencies with pressures, especially if the reaction order n is high. Considering all the species present at the surface and all sites equivalent, the available sites coverage $\theta^*$ is expressed as:

$$\theta^* = 1 - \theta_{CH_y-\theta^O} - \theta_{O_2} - \theta_{CH_4} \tag{S16}$$

where $O_X$ is the corresponding coverage of the surface X species. $\theta_{Graphene}$ is not included in Equation (S16) since the quasi-steady state approximation limits reaction to uncovered areas. Consequently, the total number of free sites is constantly renormalizing with changing $\theta_{Graphene}$ and this is taken into account by including the factor $(1-\theta_{Graphene})$ in Equation (S15).

Substituting $\theta_X$ with their corresponding expressions (S8), (S9), (S10), (S12) in (S16) gives:

$$1 = \theta_* \left( 1 + K_1 P_{CH_4} + \right. \tag{S17}$$

$$\left. K_2 P_{O_2} \left(1 + \frac{2k_3}{k_7 P_{H_2}} \theta_*\right) + \frac{k_4 k_1 P_{CH_4}}{k_5 + \frac{2k_3 k_6 K_2}{k_7} \frac{P_{O_2}}{P_{H_2}}} \theta_*^n \right).$$

This expression cannot be solved explicitly for $\theta^*$ and the boundary limits will instead be evaluated. A lower limit on $\theta^*$ is found considering that $$\frac{2k_3 k_6 K_2}{k_7} \frac{P_{O_2}}{P_{H_2}} \theta_*^2 \geq 0,$$

then $$\frac{k_4 k_1 P_{CH_4}}{k_5 + \frac{2k_3 k_6 K_2}{k_7} \frac{P_{O_2}}{P_{H_2}} \theta_*^2} \leq \frac{k_4 K_1}{k_5} P_{CH_4}.$$

This results in the following expression:

$$1 \leq \theta_* \left(1 + K_1 P_{CH_4}\left(1 + \frac{k_4}{k_5}\right) + K_2 P_{O_2}\left(1 + \frac{2k_3}{k_7 P_{H_2}}\right)\right).$$

Setting a lower limit for $\theta^*$:

$$\theta_* \geq \left(1 + K_1 P_{CH_4}\left(1 + \frac{k_4}{k_5}\right) + K_2 P_{O_2}\left(1 + \frac{2k_3}{k_7 P_{H_2}}\right)\right)^{-1}.$$

On the other hand, a higher limit for $\theta^*$ can be set using relation (S17), provided that $0 \leq \theta^* \leq 1$ and gives:

$$1 \geq \theta^*(1 + K_1 P_{CH_4} + K_2 P_{O_2})$$

and $$\theta^* \leq (1 + K_1 P_{CH_4} + K_2 P_{O_2})^{-1}.$$

Boundary conditions are finally found for $\theta^*$:

$$\frac{1}{1 + K_{ads(CH_4)} P_{CH_4}\left(1 + \frac{k_{diss(CH_4)}}{k_{Graphene}}\right) + K_{ads(O_2)} P_{O_2}\left(1 + \frac{2k_{diss(O_2)}}{k_{H_2O} P_{H_2}}\right)} \leq \quad (S18)$$

$$\theta_* \leq \frac{1}{1 + K_{ads(CH_4)} P_{CH_4} + K_{ads(O_2)} P_{O_2}}$$

Based on surface science studies [C. J. Jenks, B. E. Bent, F. Zaera, J. Phys. Chem. B. 2000, 104 (14), 3017-3027], $CH_4$ molecules are hard to activate and adsorb on Cu, which points towards a very small $K_{ads(CH_4)}$. In addition, $P_{O_2}$ needs to be maintained very low—at trace level—to obtain growth conditions. With these considerations, we can estimate from the boundary condition of Equation (S18) that the unoccupied sites coverage $\theta^*$ will remain close to unity for graphene growth. This estimation is reinforced in a LEEM study where the equilibrium GIS coverage have been shown to be between 1-2% on metals (Ir(111) and Ru(0001)) with a maximum of 3% at nucleation [E. Loginova, N. C. Bartelt, P. J. Feibelman, K. F. McCarty, New J. Phys. 2009, 11(6), 063046]. This finding indicates a limited effect of the coverage parameter $\theta^*$ on the graphene growth rate expression (S15b) with varying pressures.

4) Evaluation of $k_{inhib}$

From the graphene growth rate ($r_{Graphene}$) Equation (S15b), the ratio between the growth rate in purified conditions $r_{Graphene}^p$ and growth rate in standard conditions $r_{Graphene}^s$ is:

$$\frac{r_{Graphene}^p}{r_{Graphene}^s} = \frac{1 + k_{inhib} \frac{P_{O_2}^s}{P_{H_2}^s} \theta_*^2}{1 + k_{inhib} \frac{P_{O_2}^p}{P_{H_2}^p} \theta_*^2}, \quad (S19)$$

wherein the subscripts p and s are for purified and standard conditions, respectively.

Because the $CH_4$ purifier decreases $O_2$ impurity level by at least a factor 1000, using $$P_{O_2}^p = \frac{P_{O_2}^s}{1000}$$

and $$P_{H_2}^p \cong P_{H_2}^s$$

in Equation (S19) can be rewritten as:

$$\frac{r_{Graphene}^p}{r_{Graphene}^s} = \frac{1 + k_{inhib} \frac{P_{O_2}^s}{P_{H_2}^s} \theta_*^2}{1 + k_{inhib} \frac{P_{O_2}^s}{1000 P_{H_2}^s} \theta_*^2}. \quad (S20)$$

Solving Equation (S20) for $k_{inhib}$ gives:

$$k_{inhib} = \frac{1}{\theta_*^2} \frac{P_{H_2}^s}{P_{O_2}^s} \frac{\frac{r_{Graphene}^p}{r_{Graphene}^s} - 1}{1 - \frac{r_{Graphene}^p}{r_{Graphene}^s} \frac{1}{1000}} \quad (S21)$$

$k_{inhib}$ can be evaluated using the following estimated parameters:

$\theta^* \approx 1$ (in growth conditions as shown earlier);

$$\frac{r_{Graphene}^p}{r_{Graphene}^s} \approx 30$$

$r_{Graphene}^p < 1$ min in purified conditions with respect $r_{Graphene}^s$ between 20 min and 45 min in standard condition;

$P_{O_2}^s = 7.5 \times 10^{-6}$ Torr; this is deduced using $CH_4$ gas feedstock with <15 ppm $O_2$ and 0.5 Torr $CH_4$ as used in growth conditions gives $P_{O_2}^s$ of $7.5 \times 10^{-6}$ Torr residual in the CVD chamber;

$P_{H_2}^p \cong P_{H_2}^s = 0.05$ Torr.

Substituting these parameters in Equation (S21) gives:

$$k_{inhib} = \frac{0.05 \text{ Torr}}{7.5 \times 10^{-6} \text{ Torr}} \frac{30 - 1}{1 - \frac{30}{1000}} \approx \frac{0.05 \text{ Torr}}{7.5 \times 10^{-6} \text{ Torr}} 3 = 2 \times 10^5.$$

Because the growth time in purified conditions could not be determined precisely and we know that it is faster than 1 min, the value $k_{inhib} = 2 \times 10^5$ is a lower bound.

EXAMPLE 4

Growth in the First 60 Seconds

As noted above in Example 2, originally we could not measure the growth occurring in the first minute due to the limitations of our experimental setup. In this example, we overcome these measurement shortcomings and provide information on the growth occurring during the first minute.

Shorter effective growths were measured at lower $P_{CH_4}$ by admitting and evacuating methane in the furnace while monitoring the furnace pressure. The methane exposure where retrieved and translated into an effective growth time normalized to the standard 450 mTorr methane partial pressure growth. This comparison with the longer growth time is possible in purified methane condition because in this situation the resulting coverage is directly proportional to the methane exposure (see equation S15b above). In other words, there is no additional contribution to the $O_2$ partial pressure introduced by the injection of methane.

Figure 14:
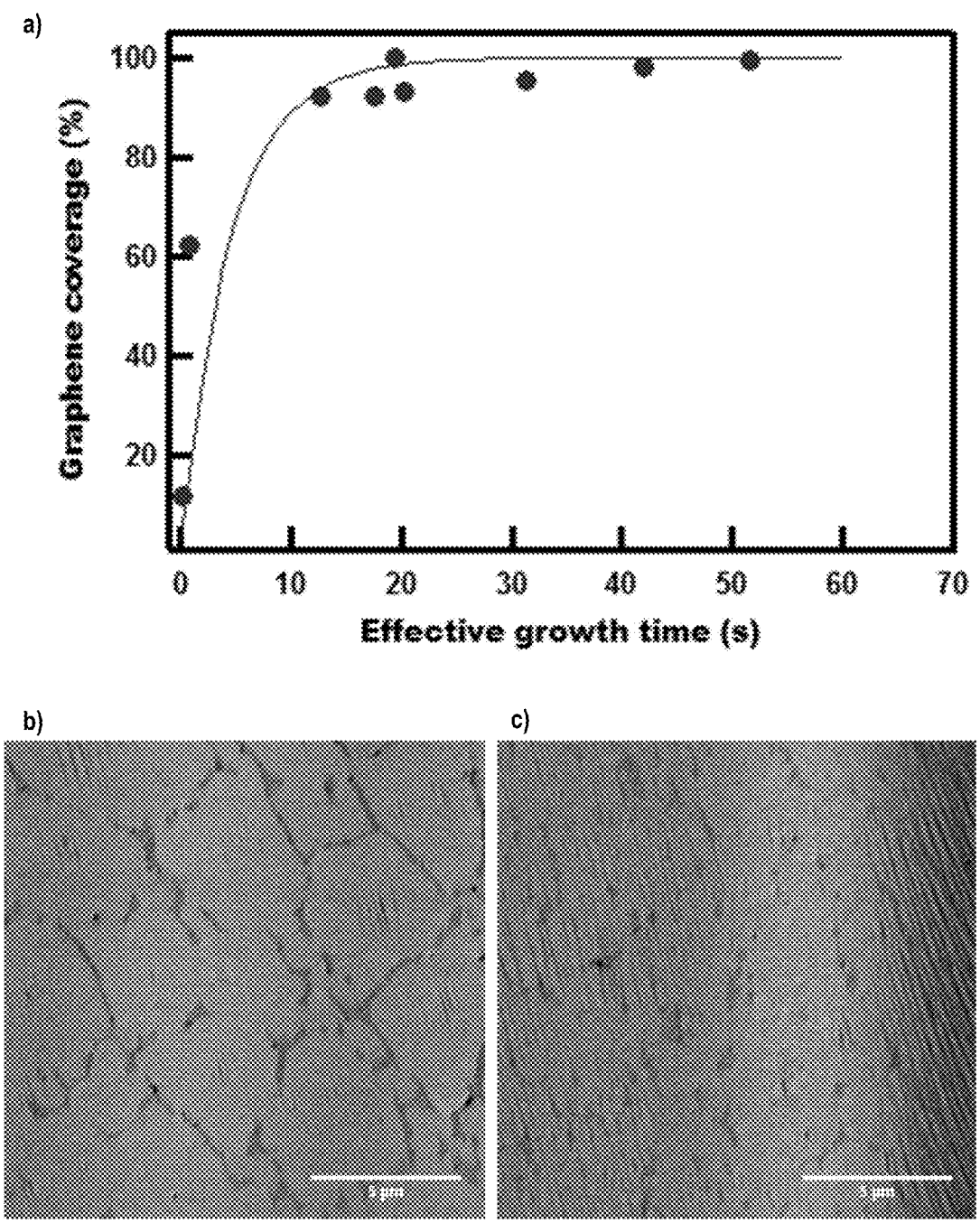

FIG. 14 reports the measured coverages for effective growth times between 0.5 s and 1 min. A coverage higher than 90% is already observed at 10 s to reach nominally 99% at 30 s. At this point, some domain boundary holes remain and will fuse together to reach completion before 1 min growth time.

Within our error, completed growth was observed within a 20s growth time. The time to completion is thus close to 1 min in the above conditions. Of course, shorter growth time would be expected using higher $CH_4$ pressures.

The scope of the claims should not be limited by the preferred embodiments set forth in the examples, but should be given the broadest interpretation consistent with the description as a whole.

REFERENCES

The present description refers to a number of documents, the content of which is herein incorporated by reference in their entirety. These documents include, but are not limited to, the following.

A. C. Ferrari, J. C. Meyer, V. Scardaci, C. Casiraghi, M. Lazzeri, F. Mauri, S. Piscanec, D. Jiang, K. S. Novoselov, S. Roth, and A. K. Geim, "Raman Spectrum of Graphene and Graphene Layers," *Physical Review Letters*, vol. 97, 2006.

A. Srivastava, C. Galande, L. Ci, L. Song, C. Rai, D. Jariwala, K. F. Kelly, and P. M. Ajayan, "Novel Liquid Precursor-Based Facile Synthesis of Large-Area Continuous, Single, and Few-Layer Graphene Films," *Chem. Mater,* 22, 3457-3461, 2010.

A. W. Robertson and J. H. Warner, "Hexagonal single crystal domains of few-layer graphene on copper foils," *Nano Letters*, vol. 11, pp. 1182-9, Mar. 9, 2011.

B. Zhang, W. H. Lee, R. Piner, I. Kholmanov, Y. P. Wu, H. F. Li, H. X. Ji, and R. S. Ruoff, *ACS Nano,* 2012, 6, 2471-2476.

C. J. Jenks, B. E. Bent, F. Zaera, J. Phys. Chem. B. 2000, 104 (14), 3017-3027.

C. Mattevi, H. Kim, and M. Chhowalla, "A review of chemical vapour deposition of graphene on copper," *Journal of Materials Chemistry*, vol. 21, p. 3324, 2011.

C. W. Magnuson, X. Kong, H. Ji, C. Tan, H. Li, R. Piner, C. A. J. Ventrice, and R. S. Ruoff, "Copper oxide as a "self-cleaning" substrate for graphene growth," *Journal of Materials Research*, 29, 403-409, 2014.

C. Z. Congqin Miao, Owen Liang and Ya-Hong Xie, "Chemical Vapor Deposition of Graphene, Physics and Application of Graphene," Intech, 52, 5, 2011.

E. Loginova, N. C. Bartelt, P. J. Feibelman, K. F. McCarty, New J. Phys. 2009, 11(6), 063046.

E. R. Monazam, R. Siriwardane, R. W. Breault, H. Tian, L. J. Shadle, G. Richards, and S. Carpenter, "Kinetics of the Reduction of CuO/Bentonite by Methane (CH4) during Chemical Looping Combustion," *Energy & Fuels*, vol. 26, pp. 2779-2785, 2012.

F. P. Bundy, Physica A, 1989, 156, 169.

H. Ago, Y. Ogawa, M. Tsuji, S. Mizuno, and H. Hibino, "Catalytic Growth of Graphene: Toward Large-Area Single-Crystalline Graphene," *Journal of Physical Chemistry Letters*, vol. 3, pp. 2228-2236, Aug. 16, 2012.

H. Kim, C. Mattevi, M. R. Calvo, J. C. Oberg, L. Artiglia, S. Agnoli, C. F. Hirjibehedin, M. Chhowalla, and E. Saiz, *ACS Nano.* 2012, 6, 3614-3623.

H. Mehdipour and K. Ostrikov, *ACS Nano.* 2012, 6, 10276-10286.

I. Vlassiouk, M. Regmi, P. F. Fulvio, S. Dai, P. Datskos, G. Eres, and S. Smirnov, "Role of Hydrogen in Chemical Vapor Deposition Growth of Large Single-Crystal Graphene," *Acs Nano*, vol. 5, pp. 6069-6076, July 2011.

I. Vlassiouk, P. Fulvio, H. Meyer, N. Lavrik, S. Dai, P. Datskos, and S. Smirnov, "Large scale atmospheric pressure chemical vapor deposition of graphene," *Carbon*, vol. 54, pp. 58-67, April 2013.

J. D. Wood, S. W. Schmucker, A. S. Lyons, E. Pop, and J. W. Lyding, *Nano Lett.* 2011, 11, 4547-4554.

J. W. Suk, A. Kitt, C. W. Magnuson, Y. F. Hao, S. Ahmed, J. H. An, A. K. Swan, B. B. Goldberg, and R. S. Ruoff, "Transfer of CVD-Grown Monolayer Graphene onto Arbitrary Substrates," *Acs Nano*, vol. 5, pp. 6916-6924, September 2011.

K. Celebi, M. T. Cole, J. W. Choi, F. Wyczisk, P. Legagneux, N. Rupesinghe, J. Robertson, K. B. K. Teo, and H. G. Park, "Evolutionary Kinetics of Graphene Formation on Copper," *Nano Letters*, vol. 13, pp. 967-974, Mar. 13, 2013.

K. HoKwon, S. Eduardo, C. Manish, and M. Cecilia, *New J. Phys.* 2013, 15, 053012.

K. Yan, H. Peng, Y. Zhou, H. Li, and Z. Liu, "Formation of bilayer bernal graphene: layer-by-layer epitaxy via chemical vapor deposition," *Nano Letters*, vol. 11, pp. 1106-10, Mar. 9, 2011.

L. B. Gao, W. C. Ren, J. P. Zhao, L. P. Ma, Z. P. Chen, and H. M. Cheng, "Efficient growth of high-quality graphene films on Cu foils by ambient pressure chemical vapor deposition," *Applied Physics Letters*, vol. 97, Nov. 1, 2010.

L. L. Fan, J. Zou, Z. Li, X. Li, K. L. Wang, J. Q. Wei, M. L. Zhong, D. H. Wu, Z. P. Xu, and H. W. Zhu, "Topology evolution of graphene in chemical vapor deposition, a combined theoretical/experimental approach toward shape control of graphene domains," *Nanotechnology*, vol. 23, Mar. 23, 2012.

L. L. Fan, Z. Li, X. Li, K. L. Wang, M. L. Zhong, J. Q. Wei, D. H. Wu, and H. W. Zhu, "Controllable growth of shaped graphene domains by atmospheric pressure chemical vapour deposition," *Nanoscale*, vol. 3, pp. 4946-4950, 2011.

L. Tao, J. Lee, H. Chou, M. Holt, R. S. Ruoff, and D. Akinwande, "Synthesis of High Quality Monolayer Graphene at Reduced Temperature on Hydrogen-Enriched Evaporated Copper (111) Films," *ACS Nano,* 6, 2319-2325, 2012.

L. X. Liu, H. L. Zhou, R. Cheng, Y. Chen, Y. C. Lin, Y. Q. Qu, J. W. Bai, I. A. Ivanov, G. Liu, Y. Huang, and X. F. Duan, "A systematic study of atmospheric pressure chemical vapor deposition growth of large-area monolayer graphene," *Journal of Materials Chemistry*, vol. 22, pp. 1498-1503, 2012.

M. Balooch, M. J. Cardillo, D. R. Miller, and R. E. Stickney, "Molecular beam study of the apparent activation barrier associated with adsorption and desorption of hydrogen on copper," *Surface Science*, vol. 46, pp. 358-392, 1974.

M. Kalbac, O. Frank, and L. Kavan, "The control of graphene double-layer formation in copper-catalyzed chemical vapor deposition," *Carbon*, vol. 50, pp. 3682-3687, 2012.

M. Losurdo, M. M. Giangregorio, P. Capezzuto, and G. Bruno, "Graphene CVD growth on copper and nickel: role of hydrogen in kinetics and structure," *Phys Chem Chem Phys*, vol. 13, pp. 20836-43, Dec. 14, 2011.

M. T. Clavaguera-Mora, J. L. Touron, J. Rodriguez-Viejo, N. Clavaguera, J. Alloys and Compounds. 2004, 377, 8-16.

N. Lisi, F. Buonocore, T. Dikonimos, E. Leoni, G. Faggio, G. Messina, V. Morandi, L. Ortolani, and A. Capasso, "Rapid and Highly Efficient Growth of Graphene on Copper by Chemical Vapor deposition of Ethanol," *Thin Solid Films,* 571, 1, 139-144, 2014.

N. Reckinger, A. Felten, C. N. Santos, B. Hackens, and J.-F. Colomer, "The influence of residual oxidizing impurities on the synthesis of graphene by atmospheric pressure chemical vapor deposition," *Carbon*, vol. 63, pp. 84-91, 2013.

N. S. Safron, M. Kim, P. Gopalan, and M. S. Arnold, "Barrier-guided growth of micro- and nano-structured graphene," *Advanced Materials,* 24, 1041-5, 2012.

P. K. Chu and L. Li, "Characterization of amorphous and nanocrystalline carbon films," *Materials Chemistry and Physics*, vol. 96, pp. 253-277, 2006.

P. R. Kidambi, C. Ducati, B. Dlubak, D. Gardiner, R. S. Weatherup, M.-B. Martin, P. Seneor, H. Coles, and S. Hofmann, "The Parameter Space of Graphene Chemical Vapor Deposition on Polycrystalline Cu," *The Journal of Physical Chemistry C*, vol. 116, pp. 22492-22501, 2012.

P. Zhao, A. Kumamoto, S. Kim, X. Chen, B. Hou, S. Chiashi, E. Einarsson, Y. Ikuhara, and S. Maruyama, *J. Phys. Chem. C.* 2013, 117, 10755-10763.

Q. Y. Li, H. Chou, J. H. Zhong, J. Y. Liu, A. Dolocan, J. Y. Zhang, Y. H. Zhou, R. S. Ruoff, S. S. Chen, and W. W. Cai, "Growth of Adlayer Graphene on Cu Studied by Carbon Isotope Labeling," *Nano Letters*, vol. 13, pp. 486-490, February 2013.

R. He, T. F. Chung, C. Delaney, C. Keiser, L. A. Jauregui, P. M. Shand, C. C. Chancey, Y. N. Wang, J. M. Bao, and Y. P. Chen, "Observation of Low Energy Raman Modes in Twisted Bilayer Graphene," *Nano Letters*, vol. 13, pp. 3594-3601, August 2013.

R. J. Madix and J. Benziger, "Kinetic Processes on Metal Single-Crystal Surfaces," *Annual Review of Physical Chemistry*, vol. 29, pp. 285-306, 1978.

R. M. Jacobberger and M. S. Arnold, "Graphene Growth Dynamics on Epitaxial Copper Thin Films," *Chemistry of Materials*, vol. 25, pp. 871-877, Mar. 26, 2013.

R. Munoz, C. Gomez-Aleixandre, "Review of CVD Synthesis of Graphene," Chem. Vap. Deposition, 19, 297-322, 2013.

R. W. Havener, H. L. Zhuang, L. Brown, R. G. Hennig, and J. Park, "Angle-Resolved Raman Imaging of Inter layer Rotations and Interactions in Twisted Bilayer Graphene," *Nano Letters*, vol. 12, pp. 3162-3167, June 2012.

S. Bae, H. Kim, Y. Lee, X. F. Xu, J. S. Park, Y. Zheng, J. Balakrishnan, T. Lei, H. R. Kim, Y. I. Song, Y. J. Kim, K. S. Kim, B. Ozyilmaz, J. H. Ahn, B. H. Hong, and S. Iijima, "Roll-to-roll production of 30-inch graphene films for transparent electrodes," *Nature Nanotechnology*, vol. 5, pp. 574-578, August 2010.

S. Bhaviripudi, X. T. Jia, M. S. Dresselhaus, and J. Kong, "Role of Kinetic Factors in Chemical Vapor Deposition Synthesis of Uniform Large Area Graphene Using Copper Catalyst," *Nano Letters*, vol. 10, pp. 4128-4133, October 2010.

S. Choubak, M. Biron, P. L. Levesque, R. Martel, and P. Desjardins, "No Graphene Etching in Purified Hydrogen," *Journal of Physical Chemistry Letters*, vol. 4, pp. 1100-1103, Apr. 4, 2013.

S. Marcet, M. Verhaegen, S. Blais-Ouellette, and R. Martel, "Raman spectroscopy hyperspectral imager based on Bragg tunable filters," 2012, pp. 84121J-84121J-7.

S. Nie, W. Wu, S. Xing, Q. Yu, J. Bao, S.-s. Pei, and K. F. McCarty, "Growth from below: bilayer graphene on copper by chemical vapor deposition," *New Journal of Physics*, vol. 14, p. 093028, 2012.

S. S. Chen, H. X. Ji, H. Chou, Q. Y. Li, H. Y. Li, J. W. Suk, R. Piner, L. Liao, W. W. Cai, and R. S. Ruoff, *Adv. Mater.* 2013, 25, 2062-2065.

T. Kobayashi, M. Bando, N. Kimura, K. Shimizu, K. Kadono, N. Umezu, K. Miyahara, S. Hayazaki, S. Nagai, Y. Mizuguchi, Y. Murakami, and D. Hobara, *Appl. Phys. Lett* 2013, 102, 023112.

T. Tomo-o and S. Koichiro, "Effect of vapor-phase oxygen on chemical vapor deposition growth of graphene," *Applied Physics Express,* 8, 035101, 2015.

V. Carozo, C. M. Almeida, E. H. Ferreira, L. G. Cancado, C. A. Achete, and A. Jorio, "Raman signature of graphene superlattices," *Nano Letters*, vol. 11, pp. 4527-34, Nov. 9, 2011.

W. Fang, A. L. Hsu, R. Caudillo, Y. Song, A. G. Birdwell, E. Zakar, M. Kalbac, M. Dubey, T. Palacios, M. S. Dresselhaus, P. T. Araujo, and J. Kong, "Rapid Identification of Stacking Orientation in Isotopically Labeled Chemical-Vapor Grown Bilayer Graphene by Raman Spectroscopy," *Nano Letters*, vol. 13, pp. 1541-1548, April 2013.

W. Zhang, P. Wu, Z. Li, and J. Yang, "First-Principles Thermodynamics of Graphene Growth on Cu Surfaces," *The Journal of Physical Chemistry C*, vol. 115, pp. 17782-17787, 2011.

Wu, D. Geng, Z. Xu, Y. Guo, L. Huang, Y. Xue, J. Chen, G. Yu, and Y. Liu, "Self-Organized Graphene Crystal Patterns," *NPG Asia Mater.,* 5, p. e36, 2013.

X. Li, C. W. Magnuson, A. Venugopal, J. An, J. W. Suk, B. Han, M. Borysiak, W. Cai, A. Velamakanni, Y. Zhu, L. Fu, E. M. Vogel, E. Voelkl, L. Colombo, and R. S. Ruoff, *Nano Lett.* 2010, 10, 4328-34.

X. Li, C. W. Magnuson, A. Venugopal, R. M. Tromp, J. B. Hannon, E. M. Vogel, L. Colombo, and R. S. Ruoff, "Large-area graphene single crystals grown by low-pressure chemical vapor deposition of methane on copper," *Journal of the American Chemical Society*, vol. 133, pp. 2816-9, Mar. 9, 2011.

X. Li, W. Cai, J. An, S. Kim, J. Nah, D. Yang, R. Piner, A. Velamakanni, I. Jung, E. Tutuc, S. K. Banerjee, L. Colombo, and R. S. Ruoff, "Large-area synthesis of high-quality and uniform graphene films on copper foils," *Science*, vol. 324, pp. 1312-4, Jun. 5, 2009.

X. S. Li, C. W. Magnuson, A. Venugopal, J. H. An, J. W. Suk, B. Y. Han, M. Borysiak, W. W. Cai, A. Velamakanni, Y. W.

Zhu, L. F. Fu, E. M. Vogel, E. Voelkl, L. Colombo, and R. S. Ruoff, "Graphene Films with Large Domain Size by a Two-Step Chemical Vapor Deposition Process," *Nano Letters*, vol. 10, pp. 4328-4334, November 2010.

Y. C. Shin and J. Kong, "Hydrogen-excluded graphene synthesis via atmospheric pressure chemical vapor deposition," *Carbon*, vol. 59, pp. 439-447, 2013.

Y. G. Yao, Z. Li, Z. Y. Lin, K. S. Moon, J. Agar, and C. P. Wong, "Controlled Growth of Multilayer, Few-Layer, and Single-Layer Graphene on Metal Substrates," *J. Phys. Chem. C*, 115, 5232-5238, 2011.

Y. Hao, M. S. Bharathi, L. Wang, Y. Liu, H. Chen, S. Nie, X. Wang, H. Chou, C. Tan, B. Fallahazad, H. Ramanarayan, C. W. Magnuson, E. Tutuc, B. I. Yakobson, K. F. McCarty, Y. W. Zhang, P. Kim, J. Hone, L. Colombo, and R. S. Ruoff, "The role of surface oxygen in the growth of large single-crystal graphene on copper," *Science*, vol. 342, pp. 720-3, Nov. 8, 2013.

Y. Yao and C.-P. Wong, "Monolayer graphene growth using additional etching process in atmospheric pressure chemical vapor deposition," *Carbon*, vol. 50, pp. 5203-5209, 2012.

Y. Z. Xue, B. Wu, L. Jiang, Y. L. Guo, L. P. Huang, J. Y. Chen, J. H. Tan, D. C. Geng, B. R. Luo, W. P. Hu, G. Yu, and Y. Q. Liu, *JACS*. 2012, 134, 11060-11063.

Y. Zhang; L. Zhang; P. Kim; M. Ge; L. Zhen; C. Zhou, "Vapor Trapping Growth of Single-Crystalline Graphene Flowers: Synthesis, Morphology, and Electronic Properties." *Nano Lett.*, 12, 2810-2816, 2012.

Y. Zhang, L. Zhang, and C. Zhou, *Acc. Chem. Res.* 2013, 46, 2329-39.

Y. Zhang, L. Zhang, P. Kim, M. Ge, Z. Li, and C. Zhou, "Vapor trapping growth of single-crystalline graphene flowers: synthesis, morphology, and electronic properties," *Nano Letters*, vol. 12, pp. 2810-6, Jun. 13, 2012.

Y. Zhang, Z. Li, P. Kim, L. Y. Zhang, and C. W. Zhou, "Anisotropic Hydrogen Etching of Chemical Vapor Deposited Graphene (vol 6, pg 126, 2012)," *Acs Nano*, vol. 6, pp. 6526-6526, July 2012.

Z. C. Li, P. Wu, C. X. Wang, X. D. Fan, W. H. Zhang, X. F. Zhai, C. G. Zeng, Z. Y. Li, J. L. Yang, and J. G. Hou, *ACS Nano*. 2011, 5, 3385-3390.

Bendiab, J. Coraux, and V. Bouchiat, "Homogeneous Optical and Electronic Properties of Graphene Due to the Suppression of Multilayer Patches During CVD on Copper Foils," *Adv. Func. Mater.*, 24, 964-970, 2014.

Z. Yan, J. Lin, Z. Peng, Z. Sun, Y. Zhu, L. Li, C. Xiang, E. L. Samuel, C. Kittrell, and J. M. Tour, *ACS Nano*. 2012, 6, 9110-9117.

The invention claimed is:

1. A method of growing a graphene coating on a catalytic substrate by chemical vapor deposition, wherein the catalytic substrate is a copper, copper-metal alloy, or semiconductor Ge catalytic substrate, the method comprising using a low pressure chemical vapor deposition (LP-CVD) system having a manifold capable of ultra-high vacuum (UHV) conditions to perform the steps of:

a) heating said catalytic substrate at a growth temperature, b) exposing the catalytic substrate heated at said growth temperature to a gaseous atmosphere of a hydrocarbon-containing gas in said LP-CVD system, wherein the system is sealed to have an air leak rate of $<1\times10^{-7}$ sccm, thereby growing the graphene coating on the catalytic substrate, and c) cooling said catalytic substrate down to a temperature at which etching of the graphene coating by oxidizing species does not occur in said LP-CVD system, wherein the system is sealed to have an air leak rate of $<1\times10^{-7}$ sccm, wherein steps b) and c) are carried out in the gaseous atmosphere in which the ratio $$\frac{P_{ox}}{P_{red}}$$

is about $5\times10^{-6}$ or less, $P_{ox}$ being the partial pressure of oxidizing species in the gaseous atmosphere and $P_{red}$ being the partial pressure of reducing species in the atmosphere, wherein steps b) and c) are carried out in the gaseous atmosphere having a reduced content of oxidizing species and comprising about 100 ppb or less of oxidizing species, wherein steps b) and c) are purified before use so as to comprise about 100 ppb or less of oxidizing species, and wherein steps a), b) and c) are carried out in a reactor surrounded by heaters, said heaters providing the temperatures required for said steps a), b) and c).

2. The method of claim 1, wherein the ratio $$\frac{P_{ox}}{P_{red}}$$

is about $5\times10^{-8}$ or less during steps b) and c).

3. The method of claim 1, wherein all gases used during steps b) and c) are purified before use so as to comprise about 10 ppb or less of oxidizing species.

4. The method of claim 1, wherein steps b) and c) are carried out under a gaseous atmosphere of a reducing species.

5. The method of claim 1, wherein step a) is carried out under a gaseous atmosphere of a reducing species or a gaseous atmosphere of an inert species.

6. The method of claim 1, wherein step a) is carried out in the absence of the hydrocarbon-containing gas.

7. The method of claim 1, wherein step c) is carried out in the absence of the hydrocarbon-containing gas.

8. The method of claim 7, wherein after step b) and prior to step c), the gaseous atmosphere of the hydrocarbon-containing gas is interrupted and the hydrocarbon-containing gas is evacuated.

9. The method of claim 1, further comprising, before step a), an annealing step comprising heating the catalytic substrate at an annealing temperature and annealing the catalytic substrate at said annealing temperature.

10. The method of claim 9, wherein the annealing step is carried out under a gaseous atmosphere of a reducing species or a gaseous atmosphere of an inert species.

11. The method of claim 9, wherein the annealing step is carried out in the absence of the hydrocarbon-containing gas.

12. The method of claim 1, wherein step b) last about 5 minutes or less.

13. The method of claim 1, wherein the hydrocarbon-containing gas is a methane.

14. The method of claim 1, wherein all gases used during steps b) and c) are purified before use so as to comprise about 1 ppb or less of oxidizing species.

15. The method of claim 1, wherein the ratio $$\frac{P_{ox}}{P_{red}}$$

is about $5\times10^{-7}$ or less during steps b) and c).

16. The method of claim 1, wherein the catalytic substrate is copper (Cu) or a Cu—Ni alloy.

17. The method of claim 1, wherein step b) last about 3 minutes or less.

18. The method of claim 1, wherein step b) last about 1 minutes or less.

19. The method of claim 1, wherein, during step b), about 90% or more surface coverage is achieved within 10 seconds.

* * * * *